(12) United States Patent
Guo

(10) Patent No.: US 11,468,934 B2
(45) Date of Patent: *Oct. 11, 2022

(54) ACCESS LINE DISTURBANCE MITIGATION

(71) Applicant: Micron Technology, Inc., Boise, ID (US)

(72) Inventor: Xinwei Guo, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/143,728

(22) Filed: Jan. 7, 2021

(65) Prior Publication Data

US 2021/0201976 A1 Jul. 1, 2021

Related U.S. Application Data

(63) Continuation of application No. 16/514,481, filed on Jul. 17, 2019, now Pat. No. 10,896,714.

(51) Int. Cl.
*G11C 11/22* (2006.01)

(52) U.S. Cl.
CPC ........ *G11C 11/2275* (2013.01); *G11C 11/221* (2013.01); *G11C 11/2273* (2013.01)

(58) Field of Classification Search
CPC .............. G11C 11/2275; G11C 11/221; G11C 11/2273; G11C 11/2255; G11C 11/2293; G11C 11/2253; G11C 11/2295; G11C 7/24; G11C 8/08; G11C 11/2257; G11C 11/2259

See application file for complete search history.

(56) References Cited

U.S. PATENT DOCUMENTS

| 8,369,177 B2 * | 2/2013 | Hold ..................... G11C 7/00 365/177 |
| 2006/0056225 A1 | 3/2006 | Hashimoto et al. |
| 2007/0297259 A1 | 12/2007 | Miyamoto |
| 2017/0372765 A1 * | 12/2017 | Kawamura ......... G11C 11/2259 |
| 2018/0358075 A1 * | 12/2018 | Di Vincenzo ....... G11C 11/5657 |
| 2019/0348098 A1 | 11/2019 | El-mansouri et al. |
| 2021/0020220 A1 * | 1/2021 | Di Vincenzo ....... G11C 11/2259 |

* cited by examiner

*Primary Examiner* — Khamdan N. Alrobaie
(74) *Attorney, Agent, or Firm* — Holland & Hart LLP

(57) ABSTRACT

Methods, systems, and devices for access line disturbance mitigation are described to, for example, reduce voltage disturbances on deselected digit lines during a read or write operation. Memory cells of a memory device may be couplable with a write circuit including a level shifter circuit, such that changes in voltage on a selected digit line may be controlled via a level shifter circuit of a write circuit associated with a selected memory cell. The write circuit may write a logic state to the memory cell after completing a read operation. One or more write voltages may be applied to or removed from the memory cell via the level shifter circuit, which may control a slew rate of one or more voltage changes on the selected digit line. The slew rate(s) may be controlled via a current driver circuit coupled with a pull-up circuit or a pull-down circuit of the level shifter circuit.

20 Claims, 12 Drawing Sheets

ACCESS LINE DISTURBANCE MITIGATION

CROSS REFERENCE

The present application for patent is a continuation of U.S. patent application Ser. No. 16/514,481 by Guo et al., entitled "FERROELECTRIC MEMORY CELL WITH ACCESS LINE DISTURBANCE MITIGATION," filed Jul. 17, 2019, assigned to the assignee hereof, and is expressly incorporated by reference in its entirety herein.

BACKGROUND

The following relates generally to a system that includes at least one memory device and more specifically to access line disturbance mitigation.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

In some memory devices, a change in voltage on a selected digit line of a memory cell may cause voltage disturbances on one or more deselected digit lines (e.g., neighboring digit lines) via capacitive coupling. Disturbances in the voltage on deselected digit lines may impact a logic state of memory cells coupled with the deselected digit lines (e.g., via a cumulative hammering effect) that may occur over one or more voltage changes.

DETAILED DESCRIPTION

Figure 1:
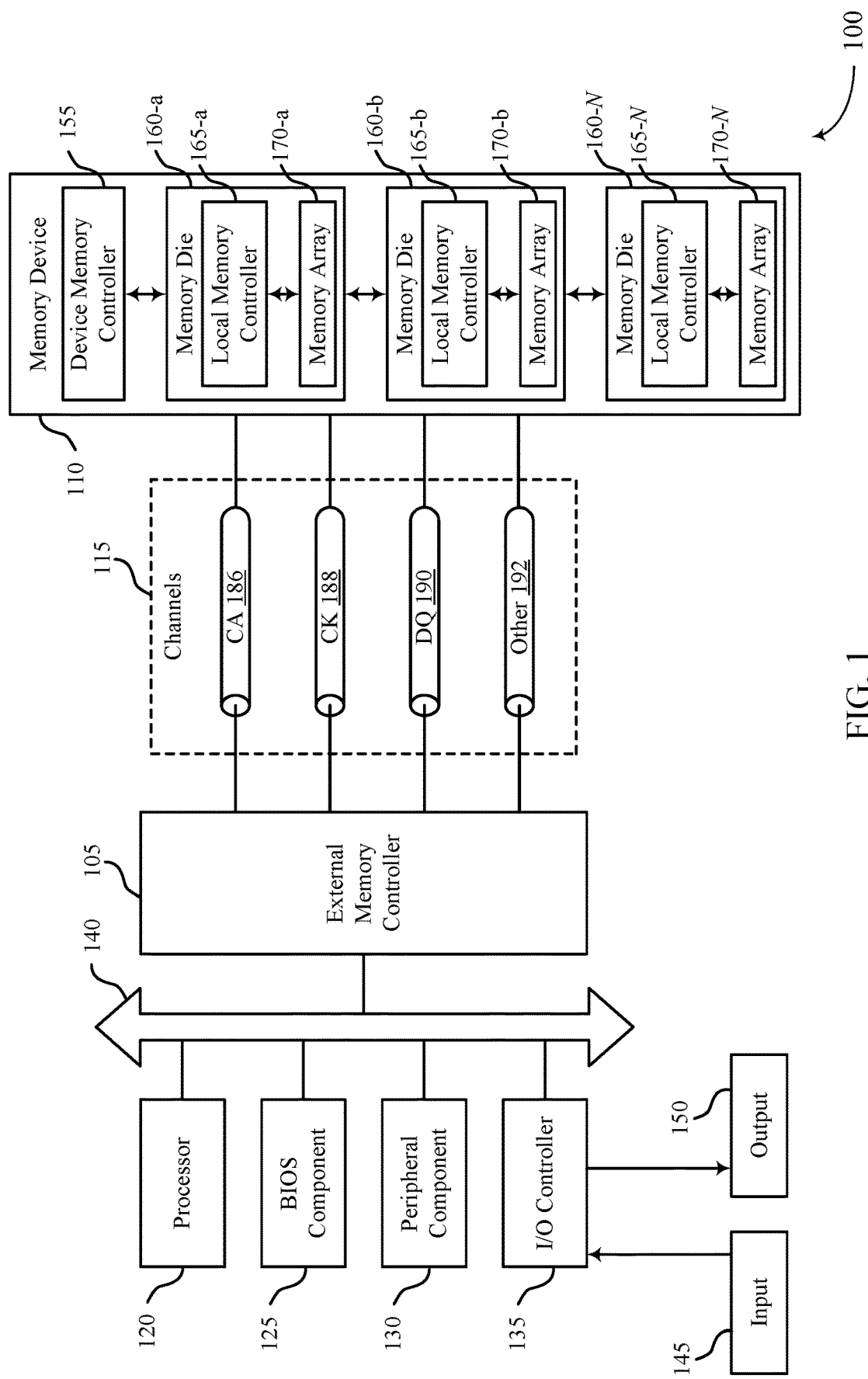
FIG. 1 illustrates an example of a system that supports access line disturbance mitigation in accordance with examples as disclosed herein.

A memory device may implement a memory cell selection procedure as part of a read or write operation, where the memory cell may be located at an intersection of a word line and a digit line. In some examples, the memory device may select the memory cell by applying a voltage to the word line and applying a voltage to the digit line (e.g., via a selection component). The voltage applied to the digit line may be used to read, write, or perform other functions on the memory cell while the digit line is coupled with the memory cell. In some examples, the memory device may deselect other digit lines between selected digit lines (e.g., by activating one or more components, such as shunts, to couple the lines with a device plate). In some memory devices, a change in voltage on the selected digit line may cause voltage disturbances on one or more deselected digit lines (e.g., neighboring digit lines) via capacitive coupling. Disturbances in the voltage on deselected digit lines may impact a logic state of memory cells coupled with the deselected digit lines, for example, via a cumulative hammering effect that may occur over multiple voltage changes.

To reduce (e.g., mitigate) voltage disturbances on the deselected digit lines, memory cells of memory device may be configured to be couplable with a write circuit including a voltage level shifter circuit. For example, changes in voltage on a selected digit line may be controlled via a voltage level shifter circuit of a write circuit associated with a selected memory cell. In some examples, the write circuit may be coupled with a sense component (e.g., a latch) used to sense a logic state of the memory cell during a read operation. The write circuit may be configured to write a logic state to the memory cell (e.g., a same logic state as previously stored on the memory cell or a different logic state) after completing the read operation. A first voltage (e.g., a write voltage) may be applied to the memory cell via a level shifter circuit (e.g., a dynamic level shifter circuit), and the level shifter circuit may control a slew rate of the first voltage change along the selected digit line (e.g., to bring the selected digit line to the write voltage). For example, the slew rate of the write voltage may be controlled via a current mirror circuit (e.g., current driver circuit or current follower circuit) coupled with a pull-up circuit of the dynamic level shifter circuit. The current mirror circuit may control a voltage or a current applied to the pull-up circuit. In some examples, lowering or otherwise adjusting the slew rate of the first voltage change along the selected digit line may result in lower voltage disturbances along neighboring digit lines.

In some examples, the selected digit line may also be grounded through the dynamic level shifter circuit. In some examples, grounding the selected digit line may apply a write voltage to the selected digit line (e.g., if a write voltage is a grounded voltage). In some examples, grounding the selected digit line may remove a write voltage (e.g., the first voltage) from the selected digit line, which may result in a second voltage change along the selected digit line. The slew rate of the second voltage change may be controlled via a current driver circuit coupled with a pull-down circuit of the dynamic level shifter circuit (e.g., by controlling a voltage applied to the pull-down circuit). Controlling the slew rate of the second voltage change may result in lower voltage disturbances along neighboring digit lines, as described above. As such, memory cells coupled with the neighboring digit lines may be unaffected or may not change a logic state as a result of the lower voltage disturbances.

Features of the disclosure are initially described in the context of a memory system and memory die as described with reference to FIGS. 1-3. Features of the disclosure are described in the context of a memory device, circuit diagrams, and timing diagrams as illustrated in FIGS. 4-6. These and other features of the disclosure are further illustrated by and described with reference to an apparatus diagram and flowcharts that relate to access line disturbance mitigation as described with reference to FIGS. 7-11.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some examples, the host device may refer to the hardware, firmware, software, or a combination thereof that implements the functions of the external memory controller 105. In some examples, the external memory controller 105 may be referred to as a host or host device. In some examples, system 100 is a graphics card.

In some examples, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some examples, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such examples, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some examples, the I/O controller 135 may represent a physical connection or port to external peripheral components.

The input 145 may represent a device or signal external to the system 100 that provides information, signals, or data to the system 100 or its components. This may include a user interface or interface with or between other devices. In some examples, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some examples, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2. A memory array 170 may be configured such that memory cells are couplable with a write circuit, which may include a level shifter circuit, as described with reference to FIGS. 4-5B.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some examples, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some examples, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some examples, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some examples, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some examples, the external memory controller 105 may include a system clock that generates a common (source) system clock signal. In some examples, the external memory controller 105 may include a common data clock that generates a common (source) data clock signal.

In some examples, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some examples, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some examples, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some examples, one or more functions ascribed herein to the device memory controller 155 or local memory controller 165 may in some examples be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some examples, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some examples, a channel 115 may be an aggregated channel and thus may include multiple individual channels. For example, a data channel 190 may be ×4 (e.g., including four signal paths), ×8 (e.g., including eight signal paths), ×16 (e.g., including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some examples, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some examples, the CA channels 186 may be registered on a rising clock signal edge and/or a falling clock signal edge. In some examples, a CA channel 186 may include any quantity of signal paths to decode address and command data (e.g., eight or nine signal paths).

In some examples, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some examples, the clock signal may be a differential output (e.g., a CK_t signal and a CK_c signal) and the signal paths of the CK channels 188 may be configured accordingly. In some examples, the clock signal may be single ended. A CK channel 188 may include any quantity of signal paths. In some examples, the clock signal CK (e.g., a CK_t signal and a CK_c signal) may provide a timing reference for command and addressing operations for the memory device 110, or other system-wide operations for the memory device 110. The clock signal CK may therefore be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some examples, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some examples, the channels 115 may include one or more other channels 192 that may be dedicated to other purposes. These other channels 192 may include any quantity of signal paths.

In some examples, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some examples, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some examples, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some examples, the signal paths may at least partially include a high-density interposer, such as a silicon interposer or a glass interposer.

Signals communicated over the channels 115 may be modulated using a variety of different modulation schemes.

In some examples, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., PAM3 signal or PAM4 signal) may be a signal that is modulated using a modulation scheme that includes at least three levels to encode more than one bit of information per symbol. Multi-symbol modulation schemes and symbols may alternatively be referred to as non-binary, multi-bit, or higher-order modulation schemes and symbols.

To reduce (e.g., mitigate) voltage disturbances on deselected digit lines, memory cells of memory device 110 may be configured to be couplable with a write circuit including a voltage level shifter circuit. A first voltage (e.g., a write voltage) may be applied to a memory cell via a level shifter circuit, and the level shifter circuit may control a slew rate of a first voltage change along an associated digit line. In some examples, the digit line may also be grounded through the level shifter circuit, which in some examples, which may result in a second voltage change along the selected digit line, where a slew rate of the second voltage change may be controlled by the level shifter circuit. In some examples, lowering or otherwise adjusting the slew rate of the voltage changes along the digit line may result in lower voltage disturbances along neighboring digit lines. As such, memory cells coupled with neighboring, deselected digit lines may be unaffected or may not change a logic state as a result of the lower voltage disturbances.

Figure 2:
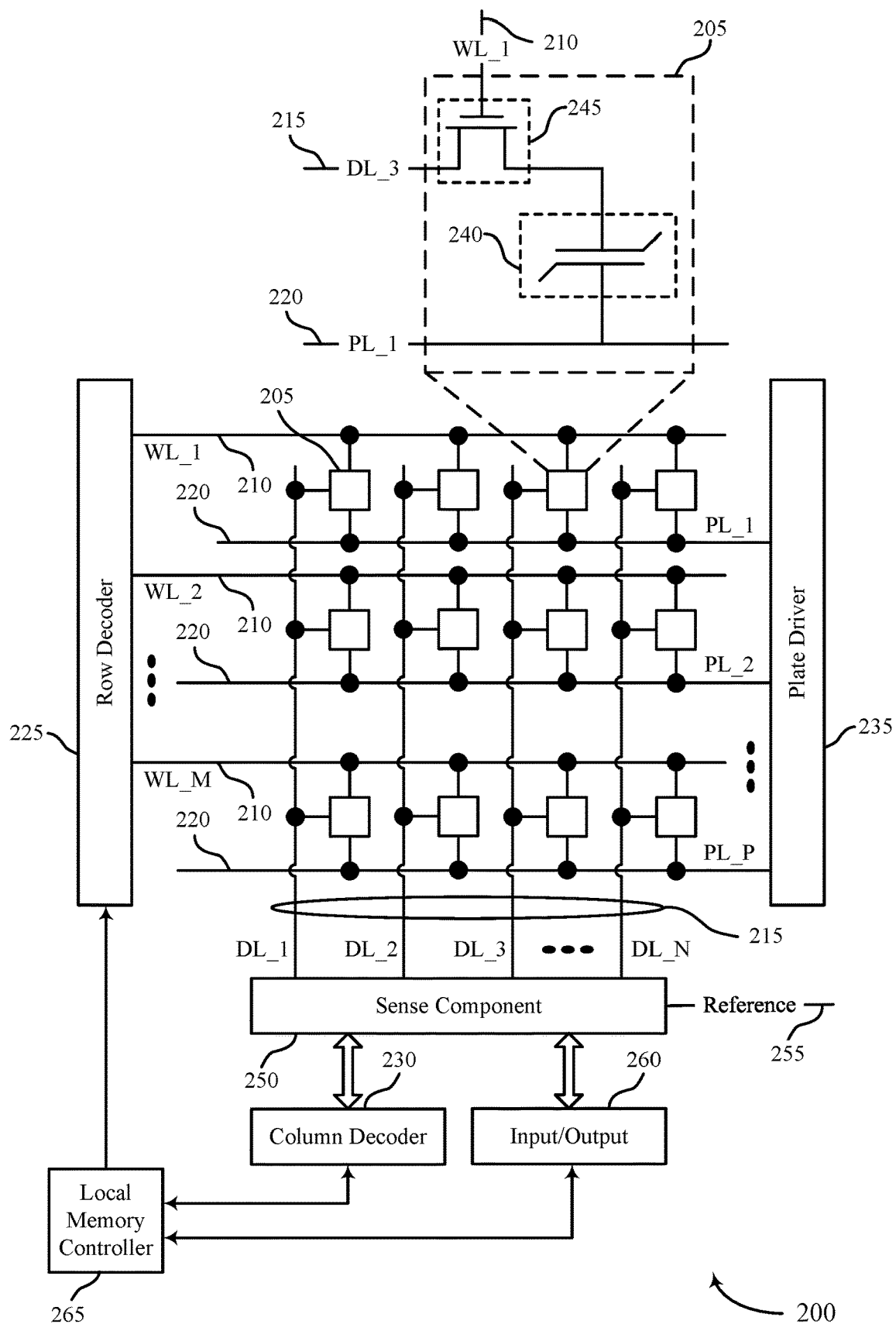
FIG. 2 illustrates an example of a memory die that supports access line disturbance mitigation in accordance with examples as disclosed herein.

FIG. 2 illustrates an example of a memory die 200 in accordance with examples as disclosed herein. The memory die 200 may be an example of the memory dice 160 described with reference to FIG. 1. In some examples, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of information at a time (e.g., a logic 0 or a logic 1). In some examples, a single memory cell 205 (e.g., a multi-level memory cell) may be configured to store more than one bit of information at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that includes a ferroelectric material to store a charge and/or a polarization representative of the programmable state. In DRAM architectures, the memory cell 205 may include a capacitor that includes a dielectric material to store a charge representative of the programmable state.

Operations such as reading and writing may be performed on memory cells 205 by activating or selecting access lines such as a word line 210, a digit line 215, and/or a plate line 220. In some examples, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some examples, the intersection of a word line 210, a digit line 215, and a plate line 220 may be referred to as an address of the memory cell 205.

The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some examples, the switching component 245 is a transistor and its operation is controlled by applying a voltage to a transistor gate, where the voltage differential between the transistor gate and transistor source is greater or less than a threshold voltage of the transistor. In some examples, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selectively couple and/or isolate the capacitor 240 of the memory cell 205 and the digit line 215. In some architectures, the memory cell 205 may be in electronic communication (e.g., constant) with the digit line 215. The digit line 215 may be coupled with a write circuit that may include a level shifter circuit, where the level shifter circuit may control voltages applied to the digit line 215 and/or removed from the digit line 215 during write operations.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205.

The sense component 250 may be configured to determine a state (e.g., a polarization state or a charge) stored on the capacitor 240 of the memory cell 205 and determine a logic state of the memory cell 205 based on the detected state. The charge stored by a memory cell 205 may be extremely small, in some examples. As such, the sense component 250 may include one or more sense amplifiers to amplify the signal output of the memory cell 205. The sense amplifiers may detect minute changes in the charge of a digit line 215 during a read operation and may produce signals corresponding to either a logic 0 or a logic 1 based on the detected charge. During a read operation, the capacitor 240 of memory cell 205 may output a signal (e.g., discharge a charge) to its corresponding digit line 215. The signal may cause a voltage of the digit line 215 to change. The sense component 250 may be configured to compare the signal received from the memory cell 205 across the digit line 215 to a reference signal 255 (e.g., a reference voltage). In some cases, the sense component 250 may integrate charge read from a memory cell 205 via a digit line 215 after a word line 210 is activated and may output an integrated charge level. The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0. The sense component 250 may include various transistors or amplifiers to detect and amplify a difference in the signals. The detected logic state of the memory cell 205 may be provided as an output of the sense component 250 (e.g., to an input/output 260), and may indicate the detected logic state to another component of a memory device 110 that includes the memory die 200, such as a device memory controller 155 (e.g., directly or using the local memory controller 265). In some examples, the sense component 250 may be in electronic communication with the row decoder 225, the column decoder 230, and/or the plate driver 235. The sense component 250 may be selectively couplable with one or more digit lines 215, and may be coupled with a digit line 215 to read and/or write data associated with a memory cell of the digit line 215. The sense component 250 may also be selectively couplable with the write circuit described above, and may provide a logic state to the write circuit to be written back to a memory cell 205 via the level shifter circuit. In some examples, the sense component 250 may include transistors with a thin gate oxide thickness and may operate using a lower voltage than other components.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200. A memory controller 265 may control a slew rate of one or more voltage changes along a selected digit line 215, according to the methods and devices described herein.

In some examples, the local memory controller 265 may be configured to perform a precharge operation on the memory die 200. A precharge operation may comprise precharging one or more components and/or access lines of the memory die 200 to one or more predetermined voltage levels. In some instances, the memory cell 205 and/or portions of the memory die 200 may be precharged between different access operations. In some instances, the digit line 215 and/or other components may be precharged before a read operation.

In some examples, the local memory controller 265 may be configured to perform a write operation (e.g., a programming operation) on one or more memory cells 205 of the memory die 200. During a write operation, a memory cell 205 of the memory die 200 may be programmed to store a desired logic state. In some examples, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some examples, the local memory controller 265 may be configured to perform a read operation (e.g., a sense operation) on one or more memory cells 205 of the memory die 200. During a read operation, the logic state stored in a memory cell 205 of the memory die 200 may be determined. In some examples, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation. The sense component 250 may couple with the write circuit after performing the read operation, to write a logic state back to the memory cell 205. In some examples, the logic state may be determined at the sense component 250 based on one or more inputs from other components (e.g., an I/O bus, the memory cell 205, etc.).

In some examples, voltages on digit lines 215 used for a write operation may be different (e.g., higher) than voltages on the digit lines 215 during a read operation. For example, read operations may result in a relatively small voltage change on the digit lines 215, which may be sensed relative to the reference signal 255. However, higher voltages on the digit lines 215 may be used to write logic states to memory cells 205. In some examples, a memory device may be constructed using a process that supports multiple types of transistors with different operating ranges. For example, a process for implementing FeRAM may include low-voltage and high-voltage transistors, where high-voltage transistors may have certain characteristics (e.g., thicker gate oxide, wider channels, different doping) that allow for the use of higher voltages before undesired effects may occur (e.g., gate oxide breakdown, source/drain junction breakdown, hot-electron tunneling, etc.). In some examples, the voltages used for the digit lines 215 for the write operation may be higher than the operating range of the low-voltage transistors of a given process node, and thus read and/or write circuitry that is involved in generating or maintaining the voltages for the write operation may employ high-voltage transistors where nodes (e.g., source, gate, drain) of the transistors are exposed to the voltages seen on the digit lines 215.

In some memory architectures, accessing the memory cell 205 may degrade or destroy the logic state stored in a memory cell 205. For example, a read operation performed on a ferroelectric memory cell may destroy (e.g., deplete) the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some examples, the re-write operation may be considered part of the read operation. Additionally, activating a single access line, such as a word line 210, may disturb the state stored in some memory cells in electronic communication with that access line (e.g., in the presence of a voltage disturbance on a digit line). Thus, a re-write operation or refresh operation may be performed on one or more memory cells that may not have been accessed.

To reduce (e.g., mitigate) voltage disturbances on deselected digit lines 215, memory cells 205 of a memory die 200 may be configured to be couplable with a write circuit including a voltage level shifter circuit, as described above. A first voltage (e.g., a write voltage) may be applied to a memory cell 205 via a level shifter circuit, and the level shifter circuit may control a slew rate of a first voltage change along an associated digit line 215. In some examples, the digit line 215 may also be grounded through the level shifter circuit, which in some examples, which may result in a second voltage change along the selected digit line 215, where a slew rate of the second voltage change may be controlled by the level shifter circuit. In some examples, lowering or otherwise adjusting the slew rate of the voltage changes along the digit line 215 may result in lower voltage disturbances along neighboring digit lines. As such, memory cells 205 coupled with neighboring, deselected digit lines 215 may be unaffected or may not change a logic state as a result of the lower voltage disturbances.

Figure 3A:
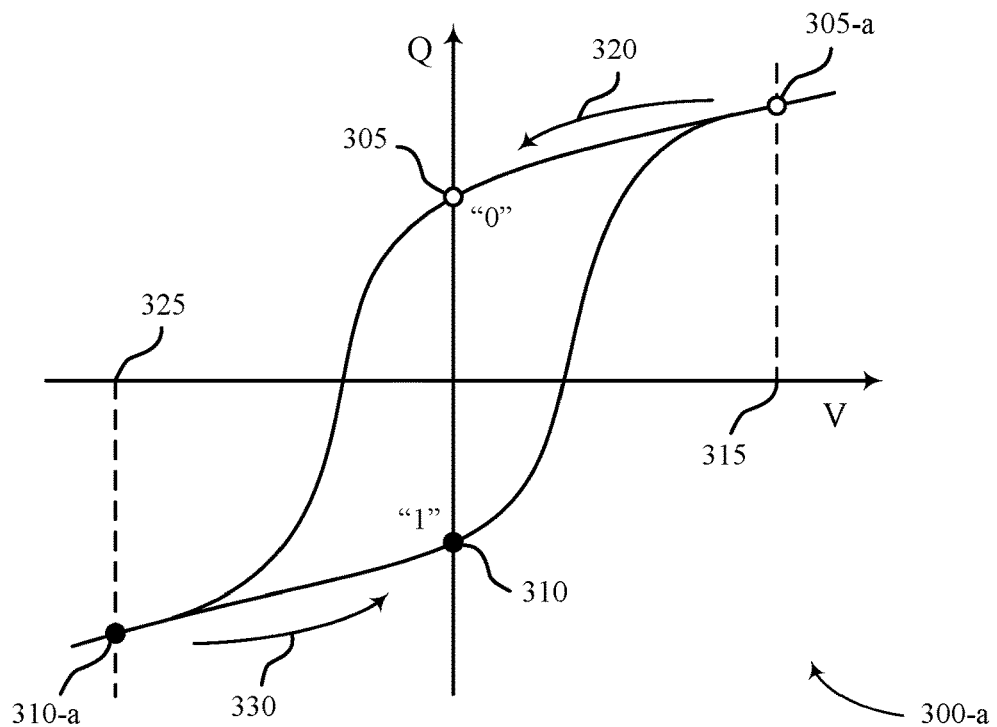
FIGS. 3A and 3B illustrate examples of hysteresis curves that support access line disturbance mitigation in accordance with examples as disclosed herein.
Figure 3B:
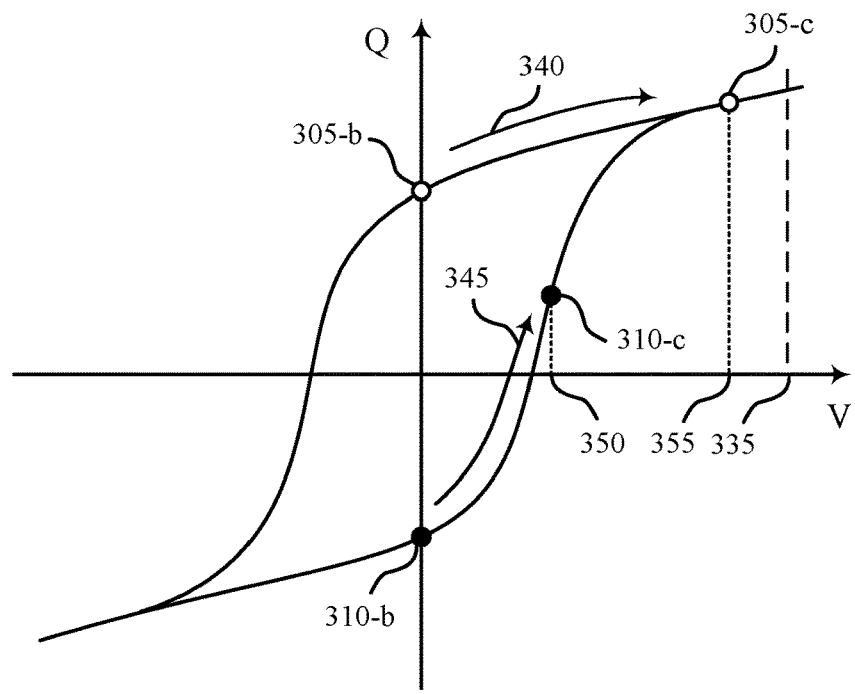
Figure 4:
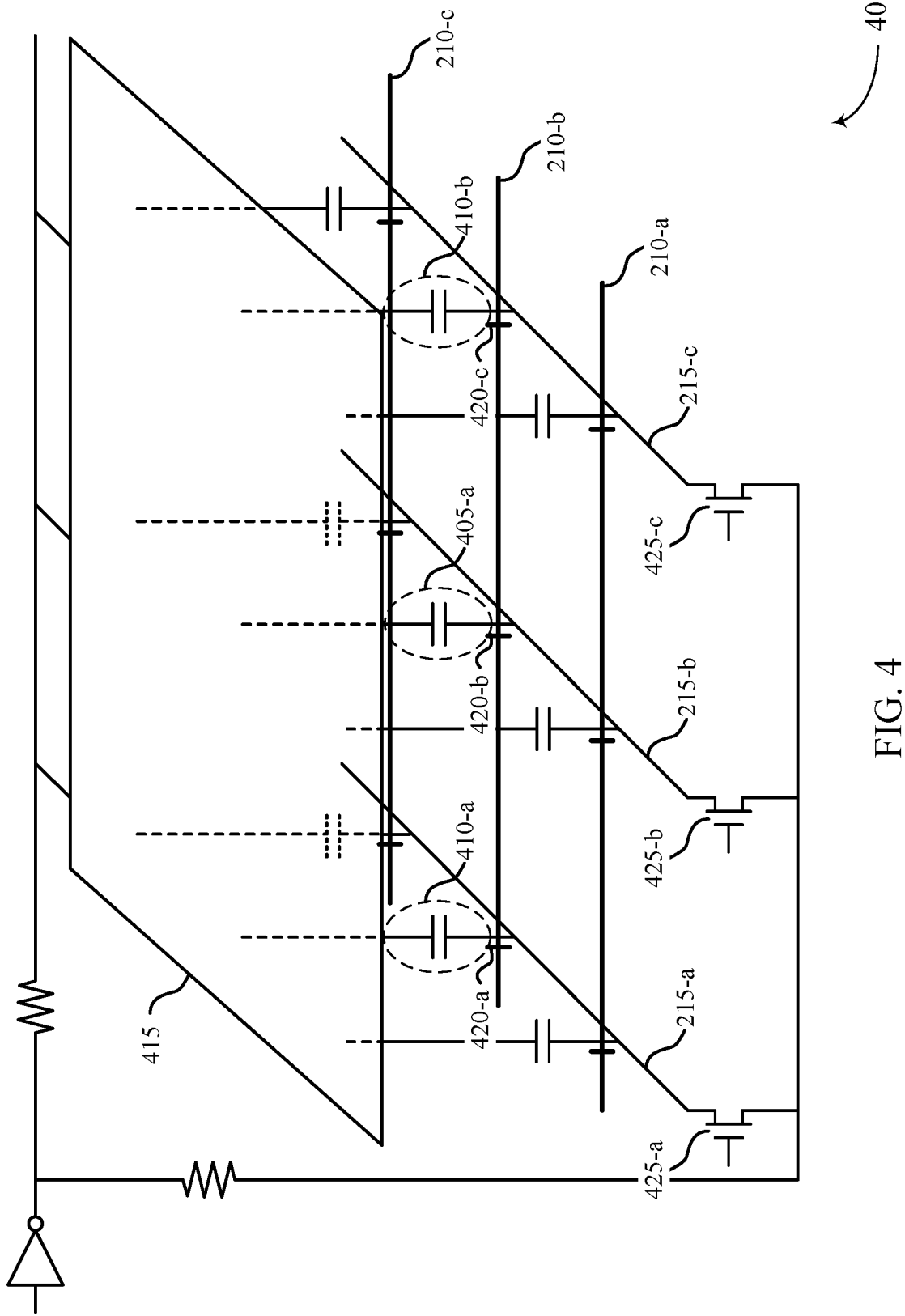
FIG. 4 illustrates an example of a memory device that supports access line disturbance mitigation in accordance with examples as disclosed herein.

FIGS. 3A and 3B illustrate examples of non-linear electrical properties of a ferroelectric memory cell with hysteresis curves 300-a and 300-b in accordance with various examples as disclosed herein. Hysteresis curves 300-a and 300-b illustrate an example ferroelectric memory cell writing and reading process, respectively. Hysteresis curves 300-a and 300-b depict the charge, Q, stored on a ferroelectric capacitor (e.g., capacitor 240 described with reference to FIG. 2) as a function of a voltage difference, V.

A ferroelectric material is characterized by a spontaneous electric polarization, that is, it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations.

Hysteresis curves 300-a and 300-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, the voltages in hysteresis curves 300-a and 300-b represent a voltage difference across the capacitor and are directional. For example, a positive voltage may be realized by applying a positive voltage to the terminal in question (e.g., a cell plate) and maintaining the second terminal (e.g., a cell bottom) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-a and 300-b.

As depicted in hysteresis curve 300-a, the ferroelectric material may maintain a positive or negative polarization with a zero-voltage difference, resulting in two possible charged states: a charge state 305 and a charge state 310. According to the examples of FIGS. 3A and 3B, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied across the capacitor 240 as discussed with reference to FIG. 2. In other examples, a fixed voltage may be applied to the cell plate and, although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on one or more factors, including the specific sensing scheme and circuitry.

In some examples, the final charge may depend on the intrinsic capacitance of the digit line connected to the memory cell. For example, if the capacitor is electrically connected to the digit line and voltage 335 is applied, the voltage of the digit line may rise due to its intrinsic capacitance. A voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., the difference between the voltage 335 and the voltage 350 or the difference between the voltage 335 and the voltage 355. A reference voltage may be generated such that its magnitude is between the two possible voltages of the two possible digit line voltages to determine the stored logic state—i.e., if the digit line voltage is higher or lower than the reference voltage. Upon comparison by the sense component, the sensed digit line voltage may be determined to be higher or lower than the reference voltage, and the stored logic value of the ferroelectric memory cell (i.e., a logic 0 or 1) may be determined. In some cases, a sense component may integrate charge read from the capacitor and may output an integrated charge level to determine the stored logic value of the ferroelectric memory cell.

In some examples, a ferroelectric memory cell may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction. In some examples, a ferroelectric memory cell may lose its initial logic state after a read operation. For example, if charge state 310-b is stored, the charge state may follow path 345 to charge state 305-c during a read operation and, after removing voltage 335, the charge state may relax to the charge state 305-b by following path 340.

Hysteresis curve 300-b illustrates an example of reading a memory cell that is configured to store the charge state 305-b and the charge state 310-b. A read voltage 335 may be applied, for example, as a voltage difference via a digit line 215 and a plate line 220 as described with reference to FIG. 2. Hysteresis curve 300-b may illustrate read operations where the read voltage 335 is a negative voltage difference Vcap (e.g., where Vbottom−Vplate is negative). A negative read voltage across the capacitor may be referred to as a "plate high" read operation, where a plate line 220 is taken initially to a high voltage, and a digit line 215 is initially at a low voltage (e.g., a ground voltage). Although read voltage 335 is shown as a negative voltage across the ferroelectric capacitor 240, in alternative operations a read voltage may be a positive voltage across the ferroelectric capacitor 240, which may be referred to as a "plate low" read operation.

The read voltage 335 may be applied across the ferroelectric capacitor 240 when a memory cell 205 is selected (e.g., by activating a switching component 245 as described with reference to FIG. 2). Upon applying the read voltage 335 to the ferroelectric capacitor 240, charge may flow into or out of the ferroelectric capacitor 240 via the digit line 215 and plate line 220, and different charge states may result depending on whether the ferroelectric capacitor 240 was at charge state 305-a (e.g., a logic 1) or at charge state 310-a (e.g., a logic 0).

FIG. 4 illustrates an example of a memory device 400 that supports access line disturbance mitigation in accordance with examples as disclosed herein. Memory device 400 may include word lines 210, digit lines 215, and an array of memory cells (e.g., including memory cell 405 and memory cells 410). In some examples, memory device 400 may be an example of a cross-point architecture, a pillar architecture, or a planar architecture. Memory device 400 may be an example of or include a memory die 200, as described with reference to FIG. 2. In some examples, memory device 400 may implement a memory cell selection procedure as part of a read or write operation, as described with reference to FIGS. 1-3.

Memory device 400 may implement a selection procedure to select a memory cell 405 (e.g., or multiple memory cells 405), where memory cell 405 may be located at an intersection of a word line 210-b and a digit line 215-b. In some examples, word line 210-b and digit line 215-b may additionally or alternatively be referred to as selected word line 210-b and selected digit line 215-b. Other word lines 210 (e.g., word lines 210-a and 210-c) may be referred to as unselected word lines 210 or deselected word lines 210, while other digit lines 215 (e.g., digit lines 215-a and 215-c) may be referred to as unselected digit lines 215 or deselected digit lines 215.

In some examples, memory device 400 may select memory cell 405 by applying a voltage to selected word line 210-b and applying a voltage to selected digit line 215-b (e.g., via a selection component). The voltage applied to word line 210-b may activate switching components 420-a, 420-b, and 420-c, and thereby couple digit lines 215-a, 215-b, and 215-c to memory cells 410-a, 405, and 410-c, respectively. The voltage applied to digit line 215-b may be used to read, write, or perform other functions on memory cell 405 while digit line 215-b is coupled with memory cell 405.

In some examples, memory device 400 may deselect other digit lines 215 (e.g., digit line 215-a and 215-c) between selected digit lines (e.g., digit line 215-b). For example, digit lines 215-a and 215-c may be deselected by activating shunts 425-a and 425-c to couple digit lines 215-a and 215-c with a plate 415, where the plate 415 may be coupled with or be an example of plate lines as described with reference to FIG. 2. Plate 415 may be coupled with a top plate 430 of each memory cell (e.g., memory cell 405 and memory cells 410), such that the top plate 430 of each memory cell may be at a same voltage as plate 415. If deselected digit lines 215-a and 215-c are coupled with the plate 415 (e.g., via shunts 425-a and 425-c), the deselected digit lines 215 may also be at a same voltage as the plate 415. As such, the voltage difference across memory cells 410 (e.g., from the top plate 430 to a bottom plate 435) may be zero (e.g., because the plate 415 is coupled with the top plate 430 and the digit line 215 is coupled with the bottom plate 435, and both are at the same voltage). In some examples, maintaining a zero voltage across memory cells 410-a and 410-b may prevent disturbances to memory cells 410-a and 410-b (e.g., changes in a logic state of memory cells 410) when performing an access operation on memory cell 405. In some examples, the deselected digit lines 215 may act as a shield for any selected digit lines (e.g., digit line 215-b) during an access operation (e.g., read operation, write operation, etc.).

In some examples, a change in voltage on digit line 215-b (e.g., as a result of cell selection or activation procedures) may cause voltage disturbances on digit line 215-a, 215-c, or both. Such disturbances may cause the voltage difference across memory cell 410-a and/or 410-b to be non-zero for a period of time (e.g., until the voltage of digit line 215-a and/or 215-c equalizes with the voltage of plate 415). In some examples, memory device 400 may be configured with longer digit lines 215, for example, to realize one or more benefits (e.g., to provide area for one or more circuits, to increase a density of a memory device). The longer digit lines 215 may have a larger capacitance (e.g., when compared with non-lengthened digit lines 215), and applying or removing a voltage from such a digit line 215 may cause voltage disturbances in neighboring digit lines 215. For example, applying or removing a voltage from selected digit line 215-b may capacitively couple digit line 215-b with one or more deselected digit lines 215 (e.g., may form a bridge), such that if a voltage on digit line 215-b goes high or low, a voltage on the one or more deselected digit lines 215 may go high or low (e.g., transiently), respectively. Such disturbances in the voltage on deselected digit lines 215 (e.g., digit lines 215-a and 215-c) may impact a logic state of coupled memory cells 410 via a cumulative hammering effect that may occur over multiple voltage changes.

To reduce (e.g., mitigate) voltage disturbances on deselected digit lines 215, memory cells of memory device 400 (e.g., memory cell 405 and memory cells 410) may be configured to be couplable with a write circuit including a voltage level shifter circuit. For example, the changes in voltage on digit line 215-b may be controlled via a voltage level shifter circuit of a write circuit associated with memory cell 405. In some examples, the write circuit may be coupled with a sense component (e.g., a latch) used to sense a logic state of memory cell 405 during a read operation. The write circuit may be configured to write a logic state to memory cell 405 (e.g., a same logic state as previously stored on memory cell 405 or a different logic state) after completing the read operation. A first voltage (e.g., a write voltage) may be applied to memory cell 405 via a level shifter circuit (e.g., a dynamic level shifter circuit), and the level shifter circuit may control a slew rate of the first voltage change along digit line 215-b (e.g., to bring digit line 215-b to the write voltage). For example, the slew rate of the write voltage may be controlled via a current mirror circuit (e.g., current driver circuit or current follower circuit) coupled with a pull-up circuit of the dynamic level shifter circuit. The current mirror circuit may control a voltage or a current applied to the pull-up circuit. In some examples, lowering or otherwise adjusting the slew rate of the first voltage change along digit line 215-b may result in lower voltage disturbances along digit lines 215-a and/or 215-c.

Digit line 215-b may also be grounded through the dynamic level shifter circuit. In some examples, grounding digit line 215-b may apply a write voltage to digit line 215-b.

In some examples, grounding digit line 215-*b* may remove a write voltage (e.g., the first voltage) from digit line 215-*b*, which may result in a second voltage change along digit line 215-*b*. The slew rate of the second voltage change may be controlled via a current driver circuit coupled with a pull-down circuit of the dynamic level shifter circuit (e.g., by controlling a voltage or current applied to the pull-down circuit). Controlling the slew rate of the second voltage change may result in lower voltage disturbances along digit lines 215-*a* and/or 215-*c*, as described above. As such, memory cells coupled with digit lines 215-*a* and/or 215-*c* may be unaffected or may not change a logic state as a result of the lower voltage disturbances. In some examples, adjusting the slew rates of the first and second voltage changes may result in a small impact to cell programming times, due to cell kinetics.

Figure 5A:
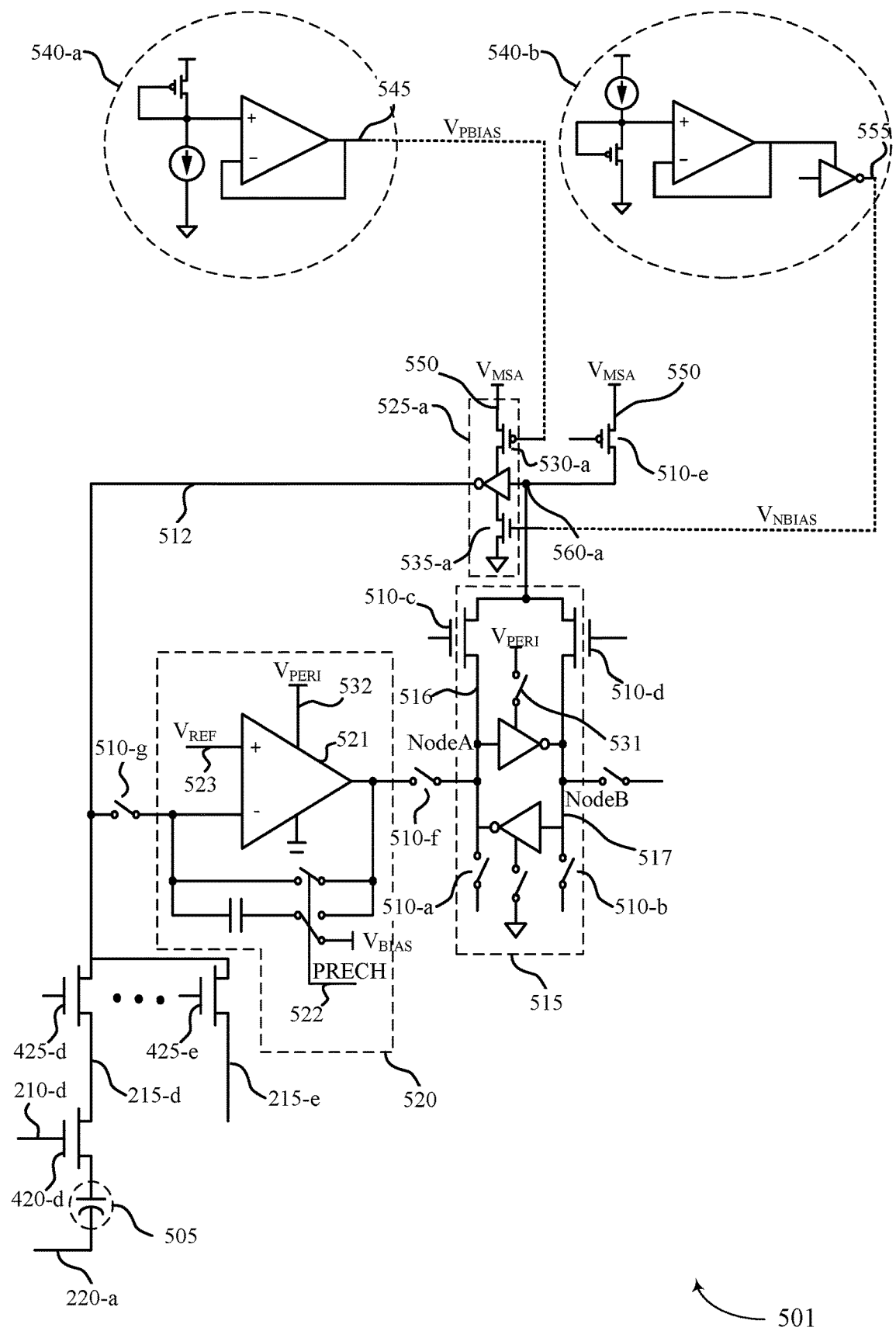
FIGS. 5A and 5B illustrate examples of circuit diagrams that support access line disturbance mitigation in accordance with examples as disclosed herein.

FIG. 5A illustrates an example of a circuit diagram 501 that supports access line disturbance mitigation in accordance with examples as disclosed herein. Circuit diagram 501 illustrates a word line 210, a digit line 215, a plate line 220, and additional components that may be coupled with a memory cell 505. Circuit diagram 501 may represent portions of a sense circuit and a write circuit used for access operations, such as a read or write operation as described with reference to FIGS. 1-4. For example, circuit diagram 501 may illustrate a write circuit that may control a slew rate of one or more voltage changes along a selected digit line 215 to reduce (e.g., mitigate) voltage disturbances to neighboring digit lines 215, as described with reference to FIG. 4. In some examples, during read or write operations associated with the selected digit line 215, the circuit illustrated in circuit diagram 501 may be selectively coupled with the selected digit line 215 and may be decoupled from other (e.g., neighboring) digit lines 215.

Memory cell 505 may be accessed or selected by applying a voltage to a word line 210-*d* to activate a switching component (e.g., switching component 420-*d*) and couple a selected digit line 215-*d* to memory cell 505. One or more voltages may be applied to digit line 215-*d* and to a plate line 220-*a* to perform an access operation (e.g., read, write, etc.) on memory cell 505. Memory cell 505 may be coupled with a sense circuit that includes an amplification component 520 and a sense component 515 (e.g., a latch) configured to sense a logic state of memory cell 505 via a voltage of digit line 215-*d* (e.g., as part of a read operation). Memory cell 505 may also be coupled with a write circuit that includes a level shifter circuit 525 (e.g., dynamic level shifter circuit 525-*a*), the write circuit being configured to write a logic state to memory cell 505 via a voltage of digit line 215-*d* (e.g., as part of a write or a write-back operation). In some examples, as illustrated, one or more portions of the write circuit may be coupled with one or more portions of the sense circuit.

Amplification component 520 and sense component 515 may be operated by applying a first supply voltage 532 (e.g., a peripheral circuitry voltage ($V_{PERI}$)), which in some examples, may enable amplification component 520 and sense component 515 to include transistors having a smaller gate oxide thickness (e.g., to be a thin oxide device) because they are not subject to voltages in excess of $V_{PERI}$. Use of thin gate devices for substantial portions of amplification component 520 and sense component 515 may improve performance of an amplifier of amplification component 520, and may provide a higher latch offset for sense component 515. In some examples, amplification component 520 and sense component 515 may include one or more switching components 510 (e.g., transistors) that may be operable to selectively couple amplification component 520 and sense component 515 with the local digit line 512 and write circuit, a memory controller, or other components of a memory device.

For a read operation of memory cell 505, digit line 215-*d* may be coupled with local digit line 512 via a shunt (e.g., shunt transistor 425-*d*) while other digit lines (e.g., digit line 215-*e*) may be decoupled with local digit line 512 via a shunt (e.g., transistor 425-*e*). Amplification component 520 may be coupled with local digit line 512 via switching component 510-*g* and may be initialized by asserting a precharge voltage PRECH 522, which may initialize differential amplifier 521 (e.g., to a bias voltage VBAS) for sensing charge on digit line 215-*d*. For example, then PRECH 522 is asserted, the negative input node and the output node of differential amplifier 521 may be coupled with $V_{BIAS}$, which may be selected to be substantially equal to a threshold voltage for thin oxide devices. The positive input node of differential amplifier 521 may be set to a reference voltage VREF which may be, for example, a ground voltage or 0V. PRECH 522 may then be deasserted and word line 210-*d* may be asserted. When PRECH 522 is deasserted, the negative input node and the output node of the differential amplifier 521 may be coupled via a capacitor, which may integrate charge from memory cell 505 when the negative input node of the differential amplifier 521 is coupled with the digit line 215-*d* via switching component 510-*g*.

Amplification component 520 may thus integrate charge read from memory cell 505 via digit line 215-*d* after word line 210-*d* is activated and may output an integrated charge level that may be lower than VBAS (e.g., when memory cell 505 is in a first state) or higher than VBAS (e.g., when memory cell 505 is in a second state). Sense component 515 may be coupled with amplification component 520 via switching component 510-*f*, and once the first supply voltage 532 is applied (e.g., via switch 531), sense component 515 may latch the sensed logic state of memory cell 505 at NodeA 516 and NodeB 517. For example, if the output of amplification component 520 is higher than a threshold voltage of the latch circuit of sense component 515 when the supply voltage 532 is applied, NodeA 516 may latch a voltage corresponding to the first supply voltage 532, while if the output of amplification component 520 is lower than the threshold voltage of the latch circuit of sense component 515 when the supply voltage 532 is applied, NodeA 516 may latch a voltage corresponding to a ground voltage or 0V. NodeA 516 may correspond to an inverted logic state of the stored logic state on memory cell 505 while NodeB 517 may correspond to the non-inverted logic state of the stored logic state on memory cell 505. Once a voltage has been acquired from memory cell 505 (e.g., sensed by amplification component 520 and latched in sense component 515), switching components 510-*g* and/or 510-*f* may switch off.

One or more of switching components 510-*a* and 510-*b* may also be activated to couple sense component 515 to an I/O bus (e.g., coupled with a memory controller) to output a logic state (e.g., inverted or non-inverted) of data resulting from a read operation of memory cell 505. One of switching components 510-*c* or 510-*d* may be activated to couple sense component 515 with the write circuit based on a determined logic state to be written to memory cell 505. In one example, switching component 510-*c* may be activated to write a logic state to memory cell 505 corresponding to the logic state previously stored on memory cell 505 (e.g., writing back a non-inverted logic state), while switching component 510-*d* may be activated to write a different logic state to memory cell 505 (e.g., a flipped or opposite logic state). Some of the switching components 510 may be subject to voltages exceeding the operating range for thin gate transistors, and thus may be thick gate devices. For example, switching components 510-c, 510-d, 510-e, and 510-g may experience voltages higher than $V_{PERI}$ on one or more nodes (e.g., source, gate, drain), and may thus be thick gate devices. Switching components 510-a, 510-b, and 510-f on the other hand may not experience voltages in excess of $V_{PERI}$, and may thus be thin gate devices. Other switching components having one or more nodes coupled directly to digit line 215-d or local digit line 512 (e.g., shunt transistors 425-d or 425-e, switching component 420-d) may also be thick gate devices.

The write circuit may be configured with a level shifter circuit 525-a, where the determined logic state may be written to memory cell 505 via the level shifter circuit 525-a. As described with reference to FIG. 4, the level shifter circuit 525-a may control a slew rate of a write voltage applied to and removed from memory cell 505 (e.g., as part of a write operation). The level shifter circuit 525-a may include a pull-up circuit 530-a (e.g., a positive metal oxide semiconductor (PMOS) transistor) coupled with a current mirror circuit 540-a (e.g., where current mirror circuit 540-a and pull-up circuit 530-a make a current driver circuit) that may control a gate of the pull-up circuit 530-a via a voltage $V_{PBIAS}$ 545. The pull-up circuit 530-a may be coupled with the write circuit via an inverter, such that a second supply voltage $V_{MSA}$ 550 may be applied to digit line 215-d via the dynamic level shifter circuit 525-a. The dynamic level shifter circuit 525-a may be configured such that current mirror circuit 540-a may control $V_{PBIAS}$ 545, which may control a current and/or voltage through the pull-up circuit 530-a and enable the dynamic level shifter circuit 525-a to control a slew rate when applying $V_{MSA}$ 550 to memory cell 505.

The dynamic level shifter circuit 525-a may also include a pull-down circuit 535-a (e.g., an negative metal oxide semiconductor (NMOS) transistor) coupled with a current mirror circuit 540-b (e.g., a current driver circuit) that may control an gate of the pull-down circuit 535-a via a voltage $V_{NBIAS}$ 555. The pull-down circuit 535-a may be coupled with the write circuit via an inverter, such that a write voltage (e.g., $V_{MSA}$ 550 or ground) may be applied to or removed from digit line 215-d via the dynamic level shifter circuit 525-a. The dynamic level shifter circuit 525-a may be configured such that current mirror circuit 540-b may control $V_{NBIAS}$ 555, which may control a current and/or voltage through the pull-down circuit 535-a and enable the dynamic level shifter circuit 525-a to control a slew rate when driving digit line 215-d to a ground voltage.

Level shifter circuit 525-a may be configured to shift a write voltage from $V_{PERI}$ 532 to $V_{MSA}$ 550 (e.g., using the inverter and pull-up circuit 530-a or pull-down circuit 535-a). This may enable the sense component 515 to operate using $V_{PERI}$ 532, while writing to memory cell 505 using $V_{MSA}$ 550, where $V_{MSA}$ 550 may be higher than $V_{PERI}$ 532. As described above, operating the sense component 515 using $V_{PERI}$ 532 (e.g., a lower voltage) may allow the sense component 515, or the transistors of the sense component 515, to have a smaller gate oxide thickness and provide a higher latch offset. Similarly, operating level shifter circuit 525-a using $V_{MSA}$ 550 may enable dynamic level shifter circuit 525-a and associated circuitry (e.g., transistors) to employ higher voltages. In some examples, level shifter circuit 525-a may shift a write voltage from $V_{PERI}$ 532 to $V_{MSA}$ 550 using a dynamic node 560-a.

For example, switching component 510-e may be activated before writing a logic state to memory cell 505, while $V_{PBIAS}$ 545 and $V_{NBIAS}$ 555 are deasserted (e.g., $V_{PBIAS}$ may equal $V_{MSA}$ while $V_{NBIAS}$ may be at a ground state). Switching component 510-e may be activated and then deactivated to couple node 560-a with the $V_{MSA}$ voltage source, such that node 560-a may be brought to $V_{MSA}$ 550 and then left floating. The state of node 560-a at a voltage $V_{MSA}$ 550 may be referred to as a high-Z state.

If a logic state corresponding to '0' was read from memory cell 505 via amplification component 520 and sense component 515, NodeA 516 may latch a voltage corresponding to $V_{PERI}$. If a non-inverting logic state is to be written to memory cell 505, switching component 510-c may be activated, which may not affect the voltage (e.g., negligibly affect the voltage) of node 560-a, because the gate of switching component 510-c may also be at $V_{PERI}$ and thus both gate to source and gate to drain voltages of switching component 510-c may be below a threshold voltage. As such, node 560-a may remain at or nearly at $V_{MSA}$ 550 and the pull-down circuit 535-a (e.g., the NMOS of the pull-down circuit 535-a) may be activated (e.g., by activation of $V_{NBIAS}$ and $V_{PBIAS}$) to apply a ground voltage to memory cell 505 via digit line 215-d. When grounding digit line 215-d, current mirror circuit 540-b may control the voltage and/or current through the pull-down circuit 535-a, such that the slew rate may be regulated (e.g., lowered) and disturbances on neighboring digit lines 215 may be reduced. In some examples, dynamic level shifter circuit 525-a may maintain digit line 215-d at ground until the write operation is completed.

Alternatively, if a logic state corresponding to '1' was read from memory cell 505 via amplification component 520 and sense component 515, NodeA 516 may latch a ground voltage. Switching component 510-e may be activated and then deactivated to couple node 560-a with the $V_{MSA}$ voltage source, such that node 560-a may be brought to $V_{MSA}$ 550 and then left floating. In this case, when switching component 510-c is activated, dynamic node 560-a may be pulled to ground via switching component 510-c. As such, the pull-up circuit 530-a (e.g., the PMOS of the pull-up circuit 530-a) may be activated (e.g., by activating $V_{PBIAS}$ and $V_{NBIAS}$) to apply $V_{MSA}$ 550 to memory cell 505 via digit line 215-d. When applying $V_{MSA}$ 550 to digit line 215-d, current mirror circuit 540-a may control the voltage and/or current through the pull-up circuit 530-a, such that the slew rate may be regulated (e.g., lowered) and disturbances on neighboring digit lines 215 may be reduced. Once the write operation on memory cell 505 is completed, switching component 510-c may be deactivated and switching component 510-e may be activated to couple node 560-a with the $V_{MSA}$ voltage source. With node 560-a at $V_{MSA}$ 550, the pull-up circuit 530-a (e.g., the PMOS of the pull-up circuit 530-a) may be deactivated, and the pull-down circuit 535-a (e.g., the NMOS of the pull-down circuit 535-a) may be activated to apply ground and discharge digit line 215-d. When grounding digit line 215-d, current mirror circuit 540-b may control the voltage and/or current through the pull-down circuit 535-a, such that the slew rate may be regulated (e.g., lowered) and disturbances on neighboring digit lines 215 may be reduced When the digit line 215-d has been discharged and the word line 210-d deactivated, $V_{NBIAS}$ and $V_{PBIAS}$ may be deactivated, which may leave level shifter circuit 525-a in a high-impedance state such that the next read operation (e.g., on a next row or different digit line 215) can be performed using amplification component 520 and sense component 515.

As described above, switching component 510-d may be used to write back an inverted logic state to memory cell 505, with the state of dynamic node 560-*a* being determined by NodeB 517 (the inverse of NodeA 516) and the operations of level shifter circuit 525-*a* being similar to that described above.

In some examples, to reduce the possibility of node 560-*a* floating to ground when NodeA is at $V_{PERI}$, a half latch configuration may be coupled with node 560-*a*, as described with reference to FIG. 5B.

Figure 5B:
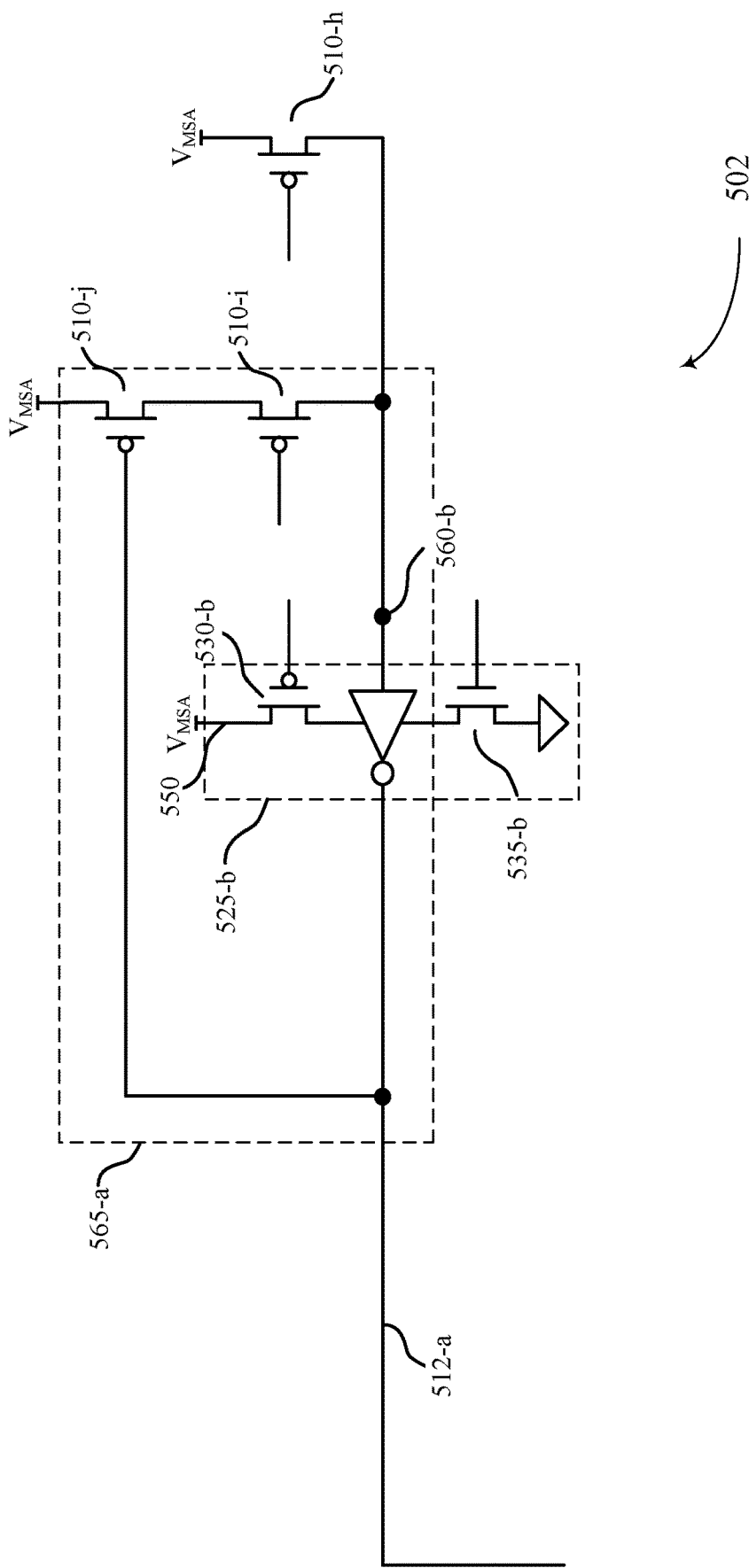

FIG. 5B illustrates an example of a circuit diagram 502 that supports access line disturbance mitigation in accordance with examples as disclosed herein. Circuit diagram 502 may be coupled with one or more components represented in circuit diagram 501, and may include additional components compared to circuit diagram 501. Circuit diagram 502 may represent portions of a write circuit coupled with a sense circuit used for access operations, such as a read or write operation as described with reference to FIGS. 1-5A. For example, circuit diagram 502 may illustrate a write circuit including a level shifter circuit 525 (e.g., dynamic level shifter circuit 525-*b*) configured to control a slew rate of one or more voltage changes along a selected digit line 215 to reduce (e.g., mitigate) voltage disturbances to other digit lines 215, as described with reference to FIGS. 4 and 5A.

Circuit diagram 502 may couple with or represent one or more portions corresponding to circuit diagram 501. For example, node 560-*b* may be an example of a node 560 or dynamic level shifter circuit 525-*b* may be an example of a dynamic level shifter circuit 525, described with reference to FIG. 5A. In some examples, dynamic level shifter circuit 525-*b* may include a pull-up circuit 530-*b* and a pull-down circuit 535-*b*, which may each be coupled with a current mirror circuit (e.g., current driver circuit) to control a current and/or voltage through the respective circuit, as described with reference to FIG. 5A. Circuit diagram 502 may also include a local digit line 512-*a*, which may be an example of or be coupled with local digit line 512 described with reference to FIG. 5A. Circuit diagram 502 may additionally include a half latch 565-*a*, which may enable node 560-*b* to avoid floating when not pulled to ground via switching component 510-*c* or switching component 510-*d*, as described with reference to FIG. 5A.

Half latch 565-*a* may include a switching component 510-*i* (e.g., a PMOS) and switching component 510-*j* (e.g., a PMOS), where switching component 510-*j* may be coupled with switching component 510-*i*, with a voltage source at $V_{MSA}$ 550, and with local digit line 512-*a*. As described with reference to FIG. 5A, a write procedure may be performed on a memory cell coupled with local digit line 512-*a*. Prior to the write procedure, node 560-*b* may be at a voltage $V_{MSA}$ 550 (e.g., by asserting switching component 510-*h*) and then left floating (e.g., when writing a logic "0" to the memory cell). In some examples, node 560-*b* may continue to float during the write procedure, and may drift to an unknown state, which may cause errors in the write procedure. Half latch 565-*a* may be used to bias node 560-*b* during the write procedure by activating switching component 510-*i* to couple node 560-*b* to $V_{MSA}$ 550 once the write voltage is established on local digit line 512-*a* As such, node 560-*b* may be maintained at $V_{MSA}$ 550 during a write portion of the write procedure and may be left floating during a time it takes to activate switching component 510-*c* or 510-*d* of FIG. 5A and establish the write voltage on local digit line 512-*a*.

Figure 6A:
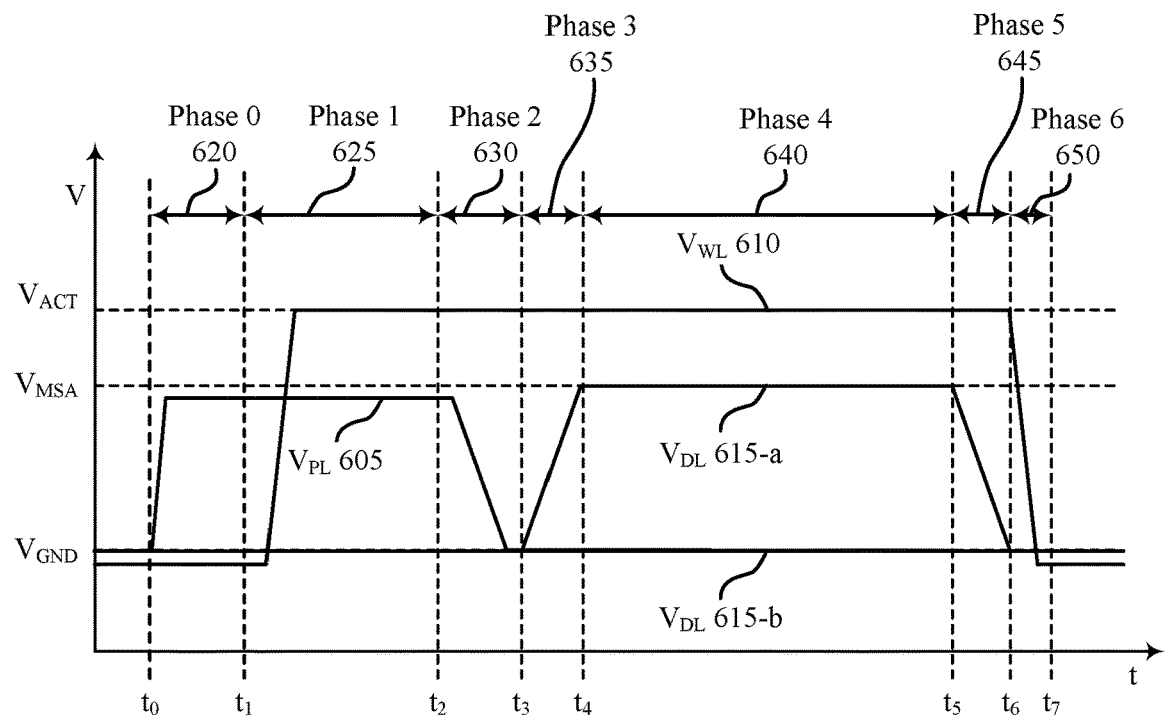
FIGS. 6A and 6B illustrate examples of timing diagrams that support access line disturbance mitigation in accordance with examples as disclosed herein.
Figure 6B:
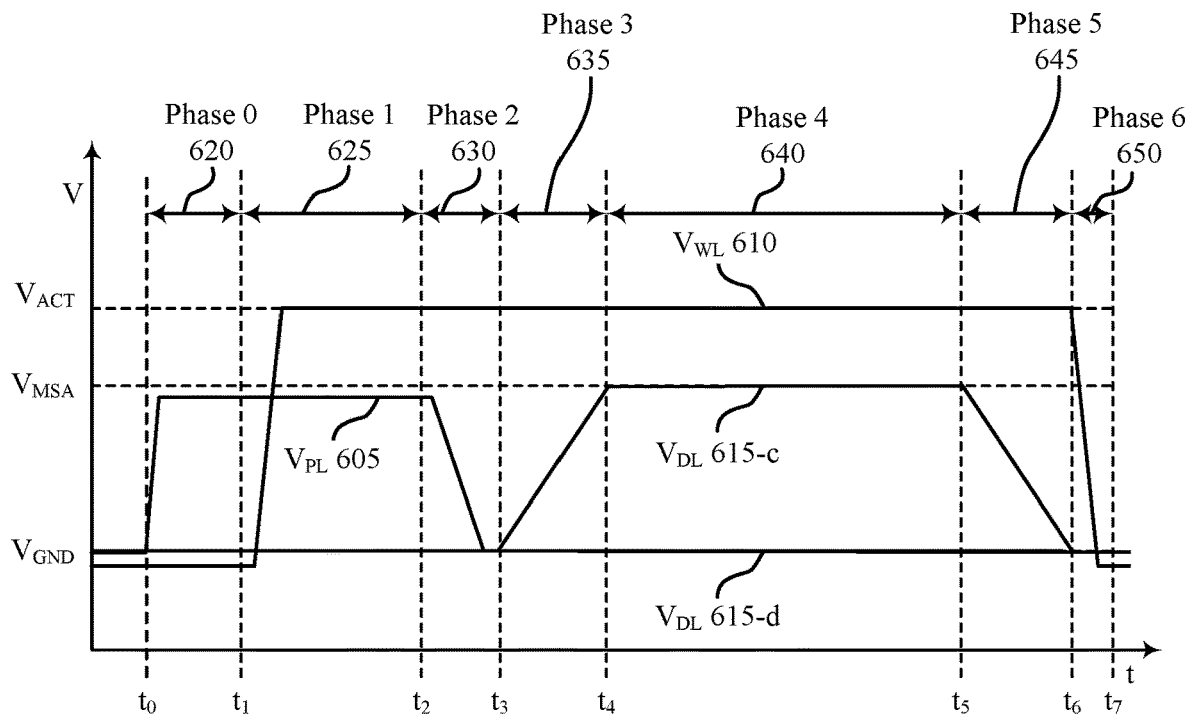

FIGS. 6A and 6B illustrate examples of timing diagrams 601 and 602 that support access line disturbance mitigation in accordance with examples as disclosed herein. Timing diagrams 601 and 602 illustrate procedures during a read operation and a corresponding write operation (e.g., rewrite operation). The read operation may correspond to a time period between t0 and t3 that includes an initial phase 620 through a second phase 630. The write operation may correspond to a time period between t3 and t7 that includes a third phase 635 through a sixth phase 650. Timing diagrams 601 and 602 show various voltage levels associated with components of the circuits depicted in circuit diagrams 501 and 502 and described with reference to FIG. 5. Timing diagrams 601 and 602 may also show voltage levels associated with one or more components of a memory device, which may be an example of memory device 400 described with reference to FIG. 4. Timing diagrams 601 and 602 may illustrate techniques for memory cell read and write procedures that may reduce disturbances on neighboring digit lines not included in the read and write procedures.

For example, timing diagrams 601 and 602 may illustrate methods for adjusting a slew rate (e.g., lowering a slew rate) of a voltage applied to a selected digit line (e.g., digit line voltage ($V_{DL}$) 615), where the adjusted slew rate may reduce disturbances on neighboring digit lines. Timing diagrams 601 and 602 include $V_{DL}$ 615, a voltage applied to a selected word line (e.g., word line voltage ($V_{WL}$) 610), and a voltage applied to a plate line (e.g., plate line voltage ($V_{PL}$) 605), where the selected digit line, and the selected word line, and plate line may correspond to portions of the memory device 400 or circuit diagrams 501 and/or 502.

During the initial phase 620 (e.g., beginning at t0), which may also be referred to as an idle period, the selected bit line and the selected word line may be kept at a constant voltage (e.g., at or near ground voltage ($V_{GND}$)). During phase 620, $V_{PL}$ 605 may be driven to a voltage (e.g., $V_{PERI}$) that may be lower than $V_{MSA}$ (e.g., a write voltage). The plate line may initialize an associated memory cell for a read and write procedure by biasing a first plate of a memory cell such that a second plate of the cell coupled with the digit line may rise to a voltage based on a logic state stored in the memory cell. As such, initial phase 620 may be referred to as a digit line initialization phase. At or after t0, a switching component connecting the digit line to a sense amplifier may be activated, such that the voltage on the digit line may be amplified by the sense amplifier.

At t1, a first phase 625 may begin, which may be referred to as a signal development phase. At or after t1, $V_{WL}$ 610 may be driven to an activation voltage ($V_{ACT}$) to activate a switching component and couple the digit line with the memory cell (e.g., where the digit line may already be coupled with the sense amplifier). $V_{DL}$ 615 may remain at or near $V_{GND}$ during first phase 625, although a small difference in $V_{DL}$ 615 that depends on the logic state stored in the memory cell may be detected by the amplification component.

At t2, a second phase 630 may begin, which may be referred to as a sense stage. At or after t2, $V_{PL}$ 605 may be removed from its driving voltage and may begin falling back to $V_{GND}$. At or after t2, an isolator switching component may activate to couple the sense amplifier (e.g., amplification component 520) to a sense component (e.g., sense component 515). As such, a voltage based on the logic state stored on the memory cell and sensed via the digit line and the sense amplifier (e.g., which may determine the logic state based on comparing the voltage developed on the digit line with a reference voltage) may be latched (e.g., a voltage of either $V_{PERI}$ or ground may be latched) within the sense component. During the second phase 630, the switching component coupling the sense amplifier to the digit line may also be deactivated to decouple the two components. One or more components of the sense component may activate to determine the logic state of the memory cell based on the voltage developed on the sense amplifier.

At t3, the write operation may begin with a third phase 635, where third phase 635 may be referred to as a digit line charge stage. At or after t3, the isolator switching component may activate to isolate (e.g., decouple) the sense component from the sense amplifier. At or after t3, a switching component coupling a level shifter circuit node to a voltage source may be activated, such that the node may be driven to a voltage of the voltage source (e.g., $V_{MSA}$). A voltage may also be applied to activate a pull-down circuit associated with the level shifter circuit. At or after t3, one of two switching components coupling the level shifter circuit to the sense component may be activated, such that the digit line may be coupled with a voltage source (e.g., $V_{MSA}$) or a ground (e.g., $V_{GND}$) via the level shifter circuit. The voltage applied to the digit line may be based on which of the two switching components is activated, which may, in turn, be based on a logic state to write back to the memory cell.

In a first example, the logic state to write back to the memory cell may be a "1" and the digit line may be coupled with the voltage source via the level shifter circuit, such that $V_{DL}$ 615-a is driven to the voltage of the voltage source (e.g., $V_{MSA}$). A slew rate of the voltage change of $V_{DL}$ 615-a may be controlled by a current mirror circuit (e.g., current driver circuit) coupled with a pull-up circuit of the level shifter circuit, as described with reference to FIG. 5A. In some examples, as illustrated in timing diagram 602, the slew rate of $V_{DL}$ 615 may be lowered, such that a $V_{DL}$ 615-c may reach $V_{MSA}$ slower than $V_{DL}$ 615-a (e.g., third phase 635 may be longer in timing diagram 602). In a second example, the logic state to write back to the memory cell may be a "0" and the digit line may be coupled with the ground, such that $V_{DL}$ 615-b is driven to or maintained at the voltage of the ground (e.g., $V_{GND}$).

At t4, a fourth phase 640 may begin, which may be referred to as a write back stage. At or around t4, $V_{DL}$ 615 may reach a write voltage (e.g., $V_{MSA}$ or $V_{GND}$) and may maintain the write voltage for the duration of fourth phase 640 (e.g., or for most of the fourth phase 640). During fourth phase 640, the logic state may be written to the memory cell by the application of the write voltage.

At t5, a fifth phase 645 may begin, which may be referred to as a digit line discharge stage. At or after t5, components of the sense components may be deactivated by removing a voltage from the corresponding components. The switching components coupling the level shifter circuit node to the voltage source (e.g., $V_{MSA}$) and coupling the level shifter circuit to the sense component may also be deactivated. As such, the write voltage may be removed from the digit line via the level shifter circuit and the ground. In a first example, $V_{DL}$ 615-a may fall from $V_{MSA}$ to $V_{GND}$, where a slew rate of the voltage change of $V_{DL}$ 615-a may be controlled by a current mirror circuit (e.g., current driver circuit) coupled with a pull-down circuit of the level shifter circuit, as described with reference to FIG. 5A. In some examples, as illustrated in timing diagram 602, the slew rate of $V_{DL}$ 615 may be lowered, such that a $V_{DL}$ 615-c may reach $V_{GND}$ slower than $V_{DL}$ 615-a (e.g., fifth phase 645 may be longer in timing diagram 602). In a second example, the digit line may already be coupled with the ground, such that $V_{DL}$ 615-b is driven to or maintained at the voltage of the ground (e.g., $V_{GND}$).

At t6, a sixth phase 650 may begin and the discharging of the digit line may be completed. At or after t6, the pull-down circuit may be deactivated. At or after t6, $V_{ACT}$ may be removed from the word line (e.g., the word line may be deselected), such that $V_{WL}$ 610 may fall from $V_{ACT}$ to $V_{GND}$ or a voltage close to $V_{GND}$ at or before t7. In some examples, the word line may not be deselected until after the digit line is discharged.

Figure 7:
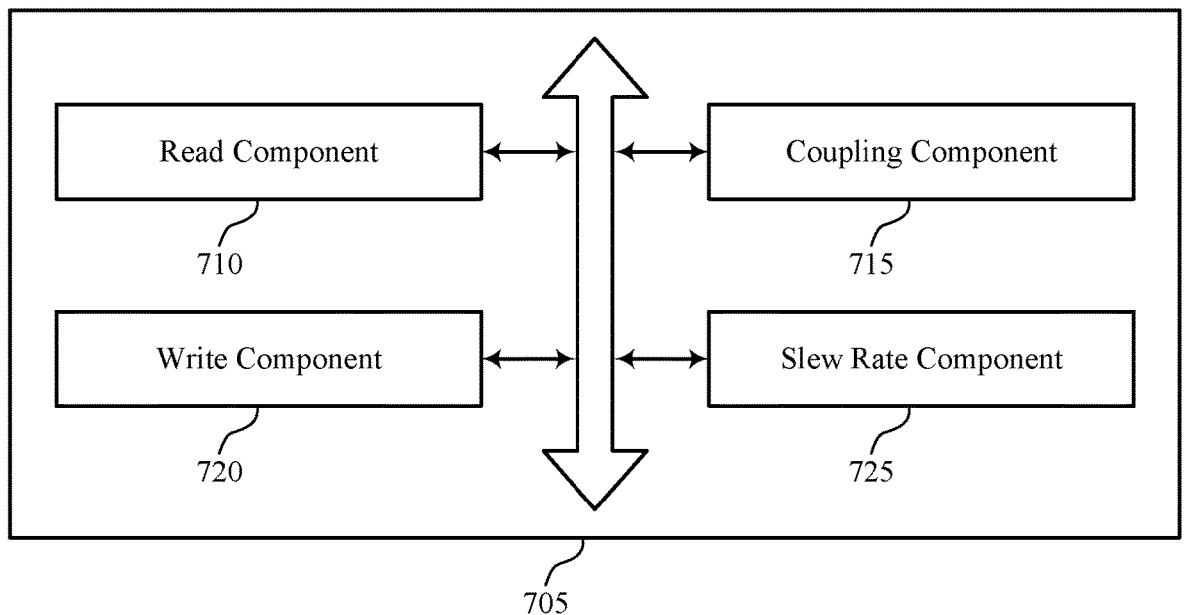
FIG. 7 shows a block diagram of a memory device that supports access line disturbance mitigation in accordance with aspects of the present disclosure.

FIG. 7 shows a block diagram 700 of a memory device 705 that supports access line disturbance mitigation in accordance with examples as disclosed herein. The memory device 705 may be an example of aspects of a memory device as described with reference to FIGS. 4-6. The memory device 705 may include a read component 710, a coupling component 715, a write component 720, and a slew rate component 725. Each of these modules may communicate, directly or indirectly, with one another (e.g., via one or more buses).

The read component 710 may read a first logic state of a ferroelectric memory cell, the reading including coupling a sense circuit to a digit line associated with the ferroelectric memory cell and latching, at the sense circuit, a first voltage or a second voltage. In some examples, reading the first logic state includes comparing a voltage generated on the digit line based on the ferroelectric memory cell with a reference voltage.

The coupling component 715 may decouple the sense circuit from the digit line based on latching the first voltage or the second voltage. In some examples, the coupling component 715 may couple the sense circuit with a write circuit based on latching the first voltage or the second voltage. In some examples, the coupling component 715 may selectively couple the digit line associated with the ferroelectric memory cell with the sense circuit for reading the first logic state and writing the second logic state.

The write component 720 may write a second logic state back to the ferroelectric memory cell, the writing including driving the digit line to a third voltage or a fourth voltage for a write back operation following reading the first logic state, where at least one of the third voltage or the fourth voltage is different than the first voltage and the second voltage. In some examples, the write component 720 may write a second logic state to the ferroelectric memory cell, the writing including controlling a first slew rate of the digit line for driving the digit line to a third voltage that is higher than the first voltage or the second voltage.

In some examples, writing the second logic state includes selecting the second logic state to be the same as the first logic state. In some examples, writing the second logic state includes inverting the first logic state to obtain the second logic state. In some examples, the first logic state is the same as the second logic state. In some examples, the first logic state is different than the second logic state.

The slew rate component 725 may control a first slew rate of the digit line when applying the third voltage. In some examples, the slew rate component 725 may control a current sourced to the digit line when applying the third voltage. In some examples, the slew rate component 725 may control a second slew rate of the digit line when driving the digit line from the third voltage to the fourth voltage. In some examples, the slew rate component 725 may control a current removed from the digit line when driving the digit line from the third voltage to the fourth voltage. In some examples, writing the second logic state to the ferroelectric memory cell includes controlling, after driving the digit line to the third voltage, a second slew rate of the digit line for driving the digit line from the third voltage to a fourth voltage.

Figure 8:
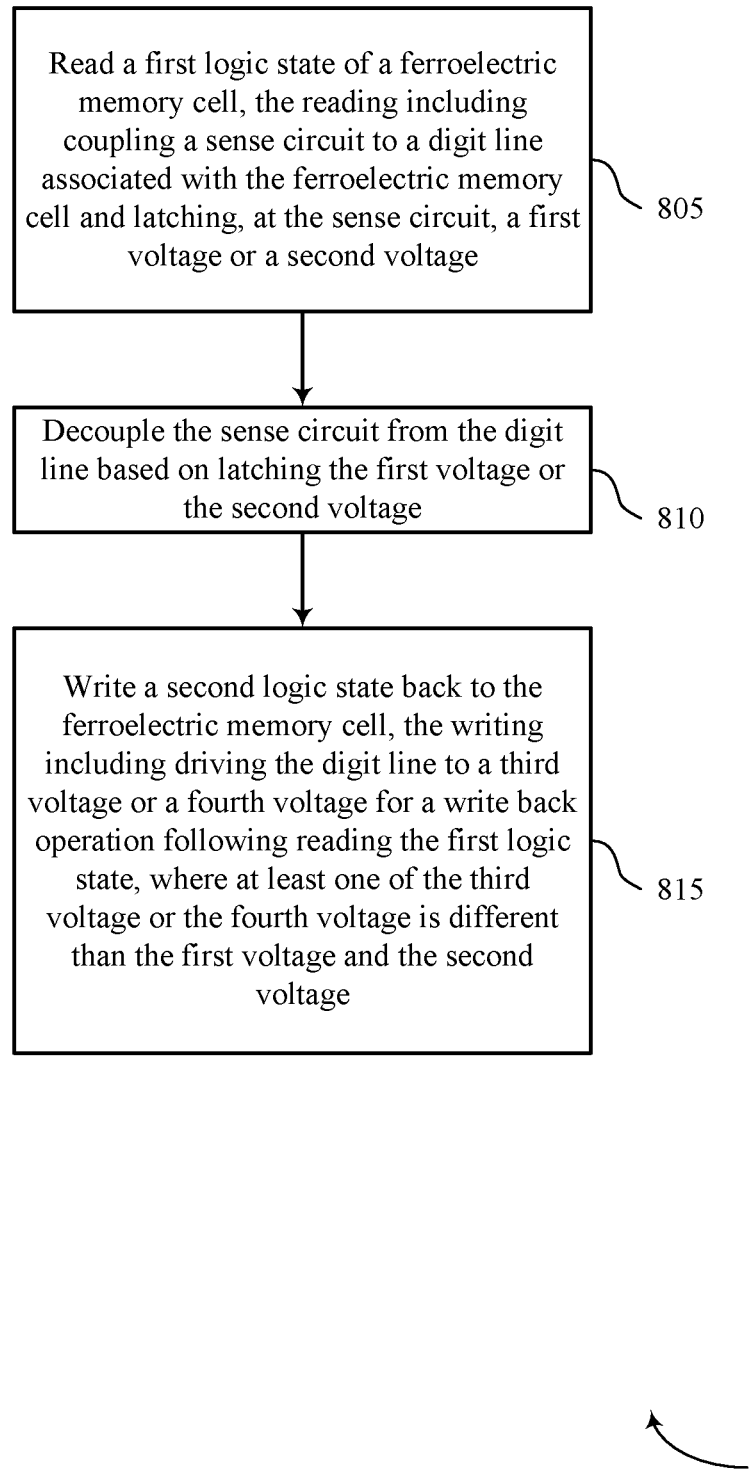
FIGS. 8 through 11 show flowcharts illustrating a method or methods that support access line disturbance mitigation in accordance with examples as disclosed herein.

FIG. 8 shows a flowchart illustrating a method or methods 800 that supports access line disturbance mitigation in accordance with aspects of the present disclosure. The operations of method 800 may be implemented by a memory device or its components as described herein. For example, the operations of method 800 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may read a first logic state of a ferroelectric memory cell, the reading including coupling a sense circuit to a digit line associated with the ferroelectric memory cell and latching, at the sense circuit, a first voltage or a second voltage. The operations of 805 may be performed according to the methods described herein. In some examples, aspects of the operations of 805 may be performed by a read component as described with reference to FIG. 7.

At 810, the memory device may decouple the sense circuit from the digit line based on latching the first voltage or the second voltage. The operations of 810 may be performed according to the methods described herein. In some examples, aspects of the operations of 810 may be performed by a coupling component as described with reference to FIG. 7.

At 815, the memory device may write a second logic state back to the ferroelectric memory cell, the writing including driving the digit line to a third voltage or a fourth voltage for a write back operation following reading the first logic state, where at least one of the third voltage or the fourth voltage is different than the first voltage and the second voltage. The operations of 815 may be performed according to the methods described herein. In some examples, aspects of the operations of 815 may be performed by a write component as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for reading a first logic state of a ferroelectric memory cell, the reading including coupling a sense circuit to a digit line associated with the ferroelectric memory cell and latching, at the sense circuit, a first voltage or a second voltage, decoupling the sense circuit from the digit line based on latching the first voltage or the second voltage, and writing a second logic state back to the ferroelectric memory cell, the writing including driving the digit line to a third voltage or a fourth voltage for a write back operation following reading the first logic state, where at least one of the third voltage or the fourth voltage is different than the first voltage and the second voltage.

In some examples of the method 800 and the apparatus described herein, reading the first logic state includes comparing a voltage generated on the digit line based on the ferroelectric memory cell with a reference voltage. In some examples of the method 800 and the apparatus described herein, writing the second logic state may include operations, features, means, or instructions for selecting the second logic state to be the same as the first logic state. In some examples of the method 800 and the apparatus described herein, writing the second logic state may include operations, features, means, or instructions for inverting the first logic state to obtain the second logic state.

Some examples of the method 800 and the apparatus described herein may further include operations, features, means, or instructions for controlling a first slew rate of the digit line when applying the third voltage. In some examples of the method 800 and the apparatus described herein, controlling the first slew rate of the digit line when applying the third voltage may include operations, features, means, or instructions for controlling a current sourced to the digit line when applying the third voltage. Some examples of the method 800 and the apparatus described herein may further include operations, features, means, or instructions for controlling a second slew rate of the digit line when driving the digit line from the third voltage to the fourth voltage. Some examples of the method 800 and the apparatus described herein may further include operations, features, means, or instructions for controlling a current removed from the digit line when driving the digit line from the third voltage to the fourth voltage.

Figure 9:
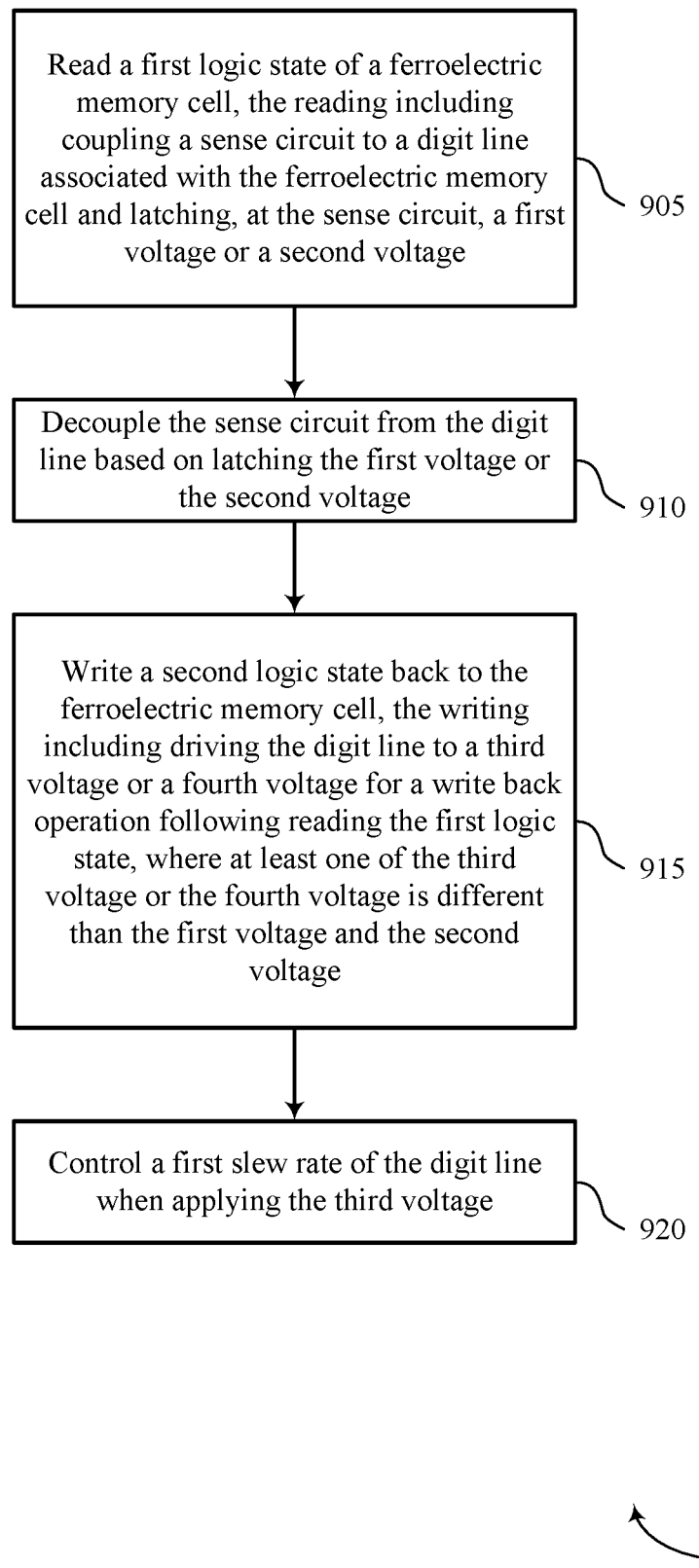

FIG. 9 shows a flowchart illustrating a method or methods 900 that supports access line disturbance mitigation in accordance with aspects of the present disclosure. The operations of method 900 may be implemented by a memory device or its components as described herein. For example, the operations of method 900 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 905, the memory device may read a first logic state of a ferroelectric memory cell, the reading including coupling a sense circuit to a digit line associated with the ferroelectric memory cell and latching, at the sense circuit, a first voltage or a second voltage. The operations of 905 may be performed according to the methods described herein. In some examples, aspects of the operations of 905 may be performed by a read component as described with reference to FIG. 7.

At 910, the memory device may decouple the sense circuit from the digit line based on latching the first voltage or the second voltage. The operations of 910 may be performed according to the methods described herein. In some examples, aspects of the operations of 910 may be performed by a coupling component as described with reference to FIG. 7.

At 915, the memory device may write a second logic state back to the ferroelectric memory cell, the writing including driving the digit line to a third voltage or a fourth voltage for a write back operation following reading the first logic state, where at least one of the third voltage or the fourth voltage is different than the first voltage and the second voltage. The operations of 915 may be performed according to the methods described herein. In some examples, aspects of the operations of 915 may be performed by a write component as described with reference to FIG. 7.

At 920, the memory device may control a first slew rate of the digit line when applying the third voltage. The operations of 920 may be performed according to the methods described herein. In some examples, aspects of the operations of 920 may be performed by a slew rate component as described with reference to FIG. 7.

Figure 10:
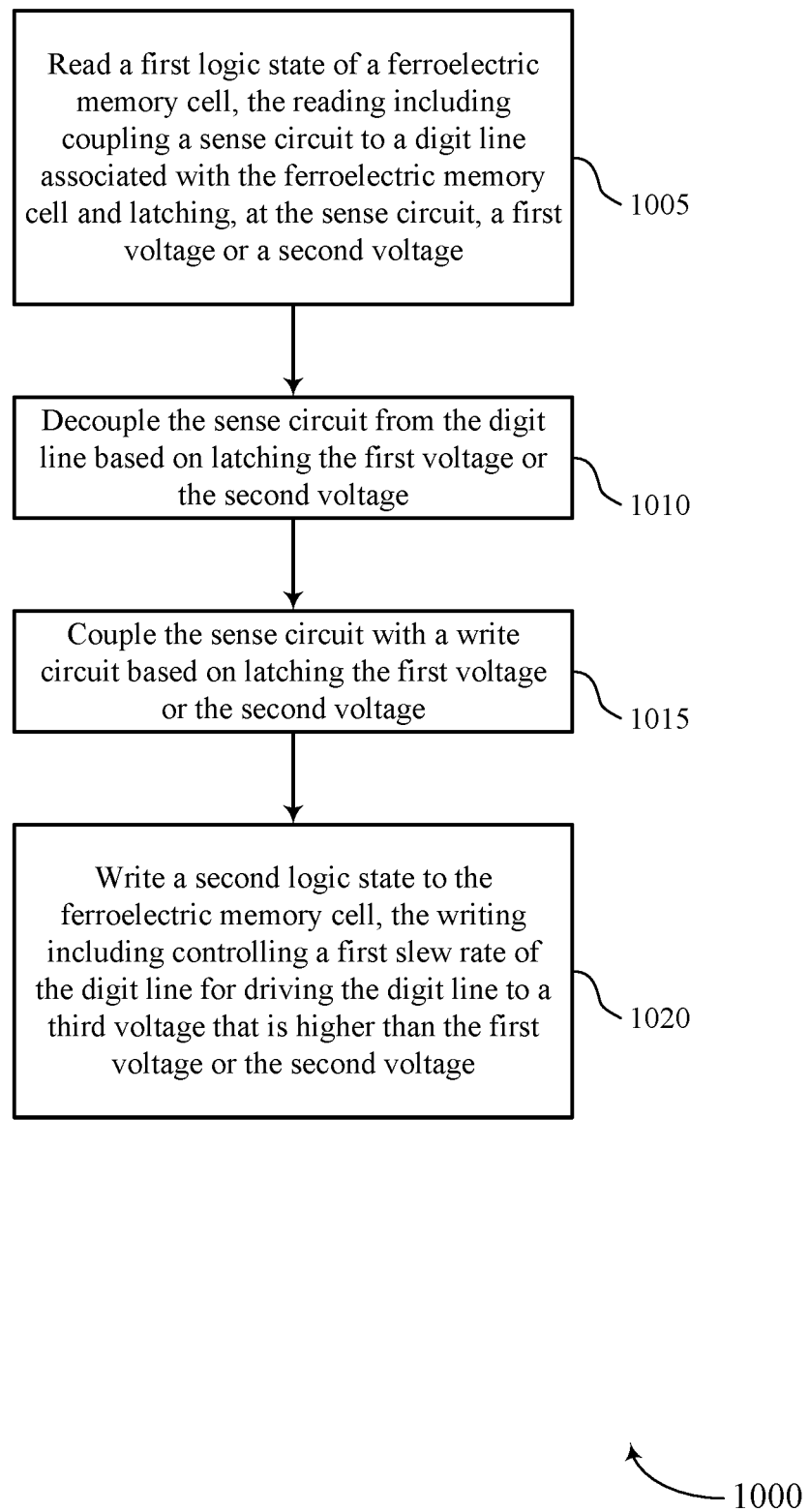

FIG. 10 shows a flowchart illustrating a method or methods 1000 that supports access line disturbance mitigation in accordance with aspects of the present disclosure. The operations of method 1000 may be implemented by a memory device or its components as described herein. For example, the operations of method 1000 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 1005, the memory device may read a first logic state of a ferroelectric memory cell, the reading including coupling a sense circuit to a digit line associated with the ferroelectric memory cell and latching, at the sense circuit, a first voltage or a second voltage. The operations of 1005 may be performed according to the methods described herein. In some examples, aspects of the operations of 1005 may be performed by a read component as described with reference to FIG. 7.

At 1010, the memory device may decouple the sense circuit from the digit line based on latching the first voltage or the second voltage. The operations of 1010 may be performed according to the methods described herein. In some examples, aspects of the operations of 1010 may be performed by a coupling component as described with reference to FIG. 7.

At 1015, the memory device may couple the sense circuit with a write circuit based on latching the first voltage or the second voltage. The operations of 1015 may be performed according to the methods described herein. In some examples, aspects of the operations of 1015 may be performed by a coupling component as described with reference to FIG. 7.

At 1020, the memory device may write a second logic state to the ferroelectric memory cell, the writing including controlling a first slew rate of the digit line for driving the digit line to a third voltage that is higher than the first voltage or the second voltage. The operations of 1020 may be performed according to the methods described herein. In some examples, aspects of the operations of 1020 may be performed by a write component as described with reference to FIG. 7.

In some examples, an apparatus as described herein may perform a method or methods, such as the method 1000. The apparatus may include features, means, or instructions (e.g., a non-transitory computer-readable medium storing instructions executable by a processor) for reading a first logic state of a ferroelectric memory cell, the reading including coupling a sense circuit to a digit line associated with the ferroelectric memory cell and latching, at the sense circuit, a first voltage or a second voltage, decoupling the sense circuit from the digit line based on latching the first voltage or the second voltage, coupling the sense circuit with a write circuit based on latching the first voltage or the second voltage, and writing a second logic state to the ferroelectric memory cell, the writing including controlling a first slew rate of the digit line for driving the digit line to a third voltage that is higher than the first voltage or the second voltage.

Some examples of the method 1000 and the apparatus described herein may further include operations, features, means, or instructions for writing the second logic state to the ferroelectric memory cell includes controlling, after driving the digit line to the third voltage, a second slew rate of the digit line for driving the digit line from the third voltage to a fourth voltage. In some examples of the method 1000 and the apparatus described herein, the first logic state may be the same as the second logic state. In some examples of the method 1000 and the apparatus described herein, the first logic state may be different than the second logic state. Some examples of the method 1000 and the apparatus described herein may further include operations, features, means, or instructions for selectively coupling the digit line associated with the ferroelectric memory cell with the sense circuit for reading the first logic state and writing the second logic state.

Figure 11:
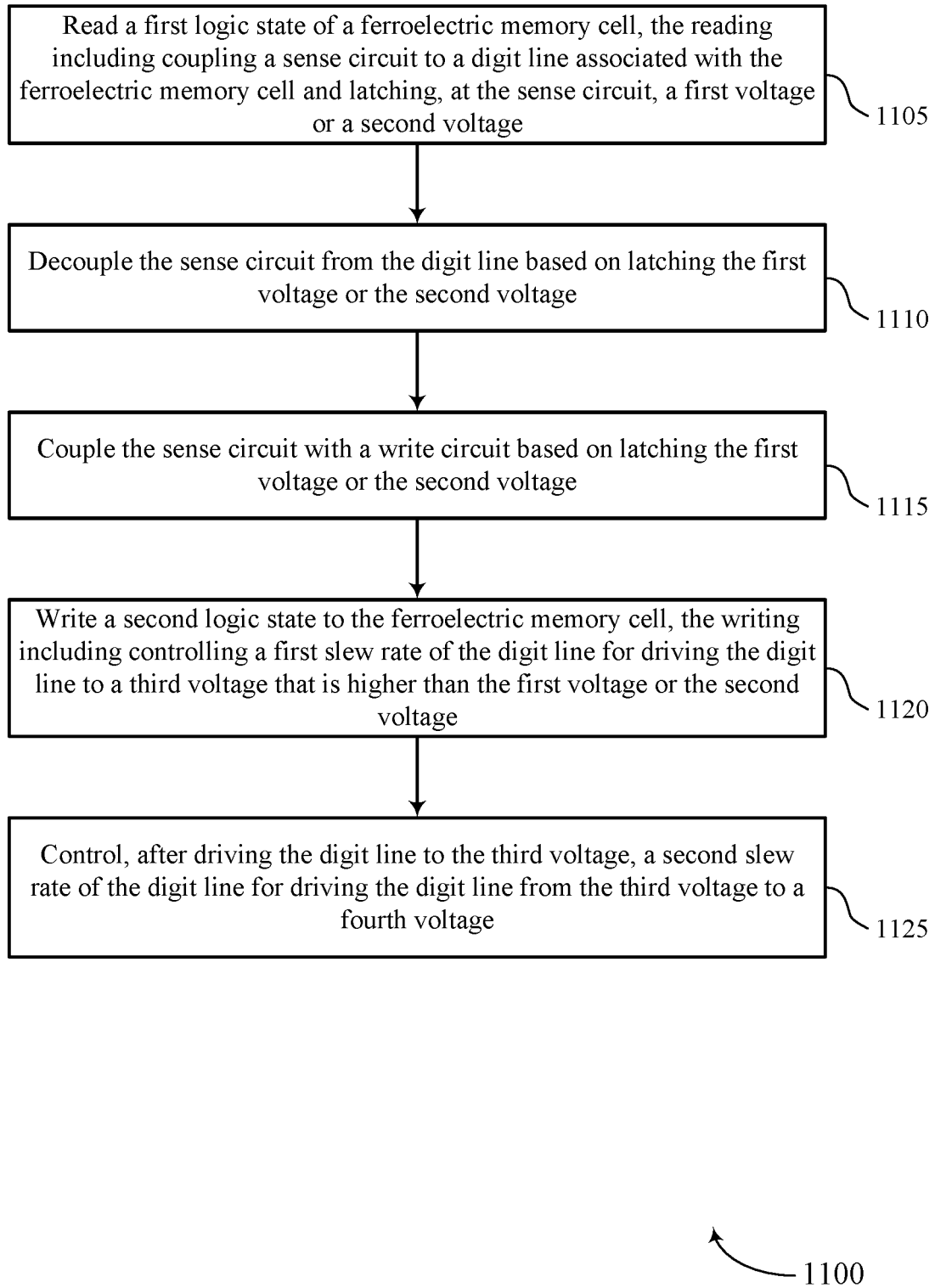

FIG. 11 shows a flowchart illustrating a method or methods 1100 that supports access line disturbance mitigation in accordance with aspects of the present disclosure. The operations of method 1100 may be implemented by a memory device or its components as described herein. For example, the operations of method 1100 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 1105, the memory device may read a first logic state of a ferroelectric memory cell, the reading including coupling a sense circuit to a digit line associated with the ferroelectric memory cell and latching, at the sense circuit, a first voltage or a second voltage. The operations of 1105 may be performed according to the methods described herein. In some examples, aspects of the operations of 1105 may be performed by a read component as described with reference to FIG. 7.

At 1110, the memory device may decouple the sense circuit from the digit line based on latching the first voltage or the second voltage. The operations of 1110 may be performed according to the methods described herein. In some examples, aspects of the operations of 1110 may be performed by a coupling component as described with reference to FIG. 7.

At 1115, the memory device may couple the sense circuit with a write circuit based on latching the first voltage or the second voltage. The operations of 1115 may be performed according to the methods described herein. In some examples, aspects of the operations of 1115 may be performed by a coupling component as described with reference to FIG. 7.

At 1120, the memory device may write a second logic state to the ferroelectric memory cell, the writing including controlling a first slew rate of the digit line for driving the digit line to a third voltage that is higher than the first voltage or the second voltage. The operations of 1120 may be performed according to the methods described herein. In some examples, aspects of the operations of 1120 may be performed by a write component as described with reference to FIG. 7.

At 1125, the memory device may control, after driving the digit line to the third voltage, a second slew rate of the digit line for driving the digit line from the third voltage to a fourth voltage. The operations of 1125 may be performed according to the methods described herein. In some examples, aspects of the operations of 1125 may be performed by a slew rate component as described with reference to FIG. 7.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a ferroelectric memory cell coupled with a row line and a digit line, a sense circuit coupled with the digit line and configured to determine a first logic state of the ferroelectric memory cell by latching a first voltage or a second voltage for a read operation of the ferroelectric memory cell, and a write circuit coupled with the digit line and the sense circuit, the write circuit configured to write a second logic state to the ferroelectric memory cell based on the first voltage or the second voltage latched by the sense circuit and write the second logic state by applying a third voltage or a fourth voltage to the digit line for a write back operation following the read operation, where at least one of the third voltage or the fourth voltage is different than the first voltage and the second voltage.

In some examples, the sense circuit further includes a sense amplifier selectively couplable with the digit line and configured to sense a charge state stored on the ferroelectric memory cell. In some examples, the write circuit may be coupled with the sense circuit via a first switchable path setting the second logic state to a same state as the first logic state and a second switchable path setting the second logic state to be inverted from the first logic state. In some examples, the third voltage may be a higher voltage than the first voltage or the second voltage, where the write circuit includes a switch that couples an input node of the write circuit to the third voltage and decouples the input node from the third voltage before the coupling of the sense circuit to the write circuit via the first switchable path or the second switchable path.

In some examples, the write circuit further includes a feedback transistor that couples an output node of the write circuit to the input node after the write circuit applies the third voltage or the fourth voltage to the digit line. In some examples, the write circuit includes a level shifter circuit configured to apply the third voltage or the fourth voltage to the digit line for a write back operation. In some examples, the level shifter circuit may be configured to control a slew rate of applying the third voltage or the fourth voltage to the digit line for a write back operation. In some examples, the level shifter circuit includes a first current driver configured to apply a first current for controlling the slew rate of applying the third voltage and a second current driver configured to apply a second current for controlling the slew rate of applying the fourth voltage.

In some examples, the third voltage may be a higher voltage than the first voltage or the second voltage, where, for the second logic state being associated with applying the third voltage for the write operation, the second current driver may be configured to control the slew rate of the digit line from the third voltage to the fourth voltage at an end of the write back operation. In some examples, the digit line may be a first digit line and the ferroelectric memory cell may be a first ferroelectric memory cell that may be accessible via a word line and the first digit line, and where the memory device includes a second ferroelectric memory cell accessible via the word line and a second digit line, and where the second digit line may be decoupled from the sense circuit and the write circuit for the read operation and the write back operation via a switch.

In some examples, the sense circuit may be coupled with a first supply voltage and the write circuit may be coupled with a second supply voltage that may be higher than the first supply voltage. In some examples, the sense circuit includes a latch for latching the first voltage or the second voltage for the read operation, the latch including a first set of transistors having a first gate oxide thickness, where the write circuit includes a driver for applying the third voltage or the fourth voltage to the digit line for the write back operation, the driver including a second set of transistors having a second gate oxide thickness.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some examples, one layer may be composed of two or more sublayers. In some of the appended figures, two dimensions of a three-dimensional layer are depicted for purposes of illustration.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a ferroelectric memory cell couplable with a digit line;
   a sense circuit couplable with the digit line and configured to determine a first logic state of the ferroelectric memory cell by latching a first voltage for a read operation of the ferroelectric memory cell; and
   a write circuit couplable with the digit line and the sense circuit, the write circuit configured to write a second logic state to the ferroelectric memory cell based at least in part on the first voltage latched by the sense circuit and by applying a second voltage to the digit line for a write back operation following the read operation, wherein the write circuit controls a first slew rate of applying the second voltage to the digit line for the write back operation.

2. The apparatus of claim 1, wherein the write circuit is further configured to control a second slew rate when driving the digit line from the second voltage to a third voltage.

3. The apparatus of claim 1, wherein the write circuit is further configured to control the first slew rate by controlling a current sourced to the digit line when applying the second voltage.

4. The apparatus of claim 1, wherein the sense circuit further comprises a sense amplifier selectively coupled with the digit line and configured to compare a reference voltage with a voltage generated on the digit line based at least in part on the ferroelectric memory cell.

5. The apparatus of claim 4, wherein the write circuit is coupled with the sense circuit via a first switchable path setting the second logic state to a same state as the first logic state and a second switchable path setting the second logic state to be inverted from the first logic state.

6. The apparatus of claim 5, wherein the second voltage is a higher voltage than the first voltage, and wherein the write circuit comprises a switch that couples an input node of the write circuit to the second voltage and decouples the input node from the second voltage before the coupling of the sense circuit to the write circuit via the first switchable path or the second switchable path.

7. The apparatus of claim 6, wherein the write circuit further comprises a feedback transistor that couples an output node of the write circuit to the input node after the write circuit applying the second voltage to the digit line.

8. The apparatus of claim 1, wherein the write circuit comprises a level shifter circuit configured to apply the second voltage to the digit line for a write back operation, the level shifter circuit configured to control the first slew rate of applying the second voltage to the digit line for the write back operation.

9. The apparatus of claim 8, wherein the level shifter circuit comprises a first current driver configured to apply a first current for controlling the first slew rate of applying the second voltage.

10. The apparatus of claim 9, wherein the second voltage is a higher voltage than the first voltage, and wherein the level shifter circuit further comprises a second current driver that is configured to control a second slew rate of the digit line from the second voltage to a third voltage at an end of the write back operation.

11. The apparatus of claim 1, wherein the digit line is a first digit line and the ferroelectric memory cell is a first ferroelectric memory cell that is accessible via a word line and the first digit line, and wherein the apparatus comprises a second ferroelectric memory cell accessible via the word line and a second digit line, and wherein the second digit line is decoupled from the sense circuit and the write circuit for the read operation and the write back operation via a switch.

12. The apparatus of claim 1, wherein the sense circuit is coupled with a first supply voltage and the write circuit is coupled with a second supply voltage that is higher than the first supply voltage.

13. The apparatus of claim 1, wherein the sense circuit comprises a latch for latching the first voltage for the read operation, the latch comprising a first plurality of transistors having a first gate oxide thickness, and wherein the write circuit comprises a driver for applying the second voltage to the digit line for the write back operation, the driver comprising a second plurality of transistors having a second gate oxide thickness.

14. A method, comprising:
   reading a first logic state of a ferroelectric memory cell, the reading comprising coupling a sense circuit to a digit line associated with the ferroelectric memory cell and latching, at the sense circuit, a first voltage;
   decoupling, the sense circuit from the digit line based at least in part on latching the first voltage; and
   writing a second logic state to the ferroelectric memory cell based at least in part on decoupling the sense circuit, the writing comprising controlling a first slew rate for driving the digit line to a second voltage.

15. The method of claim 14, wherein the writing further comprises:
   controlling a second slew rate when driving the digit line from the second voltage to a third voltage.

16. The method of claim 14, wherein the writing further comprises:
   controlling the first slew rate by controlling a current sourced to the digit line when applying the second voltage.

17. The method of claim 14, further comprising:
   coupling the sense circuit with a write circuit based at least in part on latching the first voltage.

18. The method of claim 14, wherein the second voltage is higher than the first voltage.

19. An apparatus, comprising:
   a ferroelectric memory cell couplable with a digit line;
   a sense circuit couplable with the digit line;

a write circuit couplable with the digit line and the sense circuit; and a controller operable to cause the apparatus to:
- read a first logic state of the ferroelectric memory cell, the reading comprising coupling the sense circuit to the digit line and latching, at the sense circuit, a first voltage;
- decouple the sense circuit from the digit line based at least in part on latching the first voltage; and
- write a second logic state to the ferroelectric memory cell via the write circuit, the writing comprising controlling a first slew rate for driving the digit line to a second voltage.

20. The apparatus of claim 19, wherein the controller is further operable to cause the apparatus to:
control a second slew rate when driving the digit line from the second voltage to a third voltage, wherein writing the second logic state is based at least in part on controlling the second slew rate.

* * * * *